US007803640B2

(12) United States Patent
Izumi

(10) Patent No.: US 7,803,640 B2
(45) Date of Patent: Sep. 28, 2010

(54) SEMICONDUCTOR DEVICE AND SEMICONDUCTOR PRODUCT

(75) Inventor: Kazutoshi Izumi, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 11/946,467

(22) Filed: Nov. 28, 2007

(65) Prior Publication Data

US 2008/0121959 A1    May 29, 2008

(30) Foreign Application Priority Data

Nov. 29, 2006   (JP)   ............................. 2006-322458
Mar. 1, 2007    (JP)   ............................. 2007-051967

(51) Int. Cl.
    *H01L 21/00*      (2006.01)
(52) U.S. Cl. .............................. 438/3; 438/14; 438/241; 438/244; 257/295; 257/296; 257/310; 257/369; 257/E21.009
(58) Field of Classification Search ........................ None
    See application file for complete search history.

(56) References Cited

U.S. PATENT DOCUMENTS

2002/0011616 A1* 1/2002 Inoue et al. ................. 257/295
2002/0021544 A1* 2/2002 Cho et al. ................... 361/200
2004/0084701 A1* 5/2004 Kanaya et al. .............. 257/295

FOREIGN PATENT DOCUMENTS

JP        2005-57103       3/2005

* cited by examiner

*Primary Examiner*—N Drew Richards
*Assistant Examiner*—Kyoung Lee
(74) *Attorney, Agent, or Firm*—Staas & Halsey LLP

(57) ABSTRACT

The embodiments discussed herein reduce, in a semiconductor device having a ferroelectric capacitor, the film thickness of an interlayer insulation film covering the ferroelectric capacitor without degrading yield, and reduce the invasion of water into the ferroelectric capacitor. A semiconductor device includes a first interlayer insulation film formed on a substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, the ferroelectric capacitor is formed of a lower electrode, a ferroelectric film formed on the lower electrode, an upper electrode formed on the ferroelectric film in contact therewith, and a polish-resistant film formed on the upper electrode, wherein the second interlayer insulation film covers the polish-resistant film with a film thickness of 50-100 nm.

15 Claims, 28 Drawing Sheets

US 7,803,640 B2

SEMICONDUCTOR DEVICE AND SEMICONDUCTOR PRODUCT

CROSS-REFERENCE TO RELATED APPLICATIONS

This application is related to and claims the benefit of Japanese Patent Application No. 2006-322458, filed Nov. 29, 2006, and Japanese Patent Application No. 2007-051967, filed Mar. 1, 2007, the disclosure of which is incorporated herein by reference.

TECHNICAL FIELD

The embodiments discussed herein relate to semiconductor devices and more particularly to a semiconductor device having a ferroelectric capacitor and fabrication process thereof.

BACKGROUND

A ferroelectric memory is a non-volatile voltage-driven semiconductor memory device and preferably provides high operational speed, low electric power consumption and non-volatility of information in that the information held therein is retained even when the electric power is turned off. Ferroelectric memories are already used in IC cards and other portable electronic apparatuses.

In ferroelectric memories, a ferroelectric film constituting a ferroelectric capacitor easily undergoes reduction by the reducing ambient used generally in semiconductor processes; however, such a reduction of the ferroelectric film raises a problem of ferroelectric degradation. Thus, various proposals have been made for suppressing reduction of the ferroelectric film, including Japanese Laid-Open Patent Application 2005-57103.

FIG. 1 is a cross-sectional diagram illustrating the construction of a ferroelectric memory device 10 called a stacked type device according to a related art.

Referring to FIG. 1, the ferroelectric memory device 10 is a so-called 1T1C device and includes two memory cell transistors formed in a device region 11A defined on a silicon substrate 11 by a device isolation region 11I such that the two memory cell transistors share a bit line.

More specifically, there is formed an n-type well in the silicon substrate 11 as the device region 11A, wherein there are formed, on the device region 11A, a first MOS transistor having a polysilicon gate electrode 13A and a second MOS transistor having a polysilicon gate electrode 13B via respective gate insulation films 12A and 12B.

In the silicon substrate 11, there are formed LDD regions 11a and 11b of p--type in correspondence to respective sidewalls of the gate electrode 13A, and there are further formed LDD regions 11c and 11d of p--type in correspondence to respective sidewalls of the gate electrode 13B. Thereby, the first and second MOS transistors are formed commonly in the device region 11A, and thus, the same p-type diffusion region is used as the LDD region 11b and the LDD region 11c.

On the polysilicon gate electrodes 13A and 13B, there are formed silicide layers 14A and 14B, respectively, and there are further formed sidewall insulation films on the sidewall surfaces of the polysilicon gate electrode 13A and on the sidewall surfaces of the polysilicon gate electrode 13B, respectively.

Furthermore, diffusion regions 11e and 11f of p+-type are formed in the silicon substrate 11 at respective outer sides of the sidewall insulation films of the gate electrode 13A, and diffusion regions 11g and 11h of p+-type are formed in the silicon substrate 11 at respective outer sides of the sidewall insulation films of the gate electrode 13B. Furthermore, diffusion regions 11f and 11g are formed by the same p+-type diffusion region.

Further, on the silicon substrate 11, there is formed an SiON film 15 so as to cover the gate electrode 13A including the silicide layer 14A and the sidewall insulation films of the gate electrode 13A and so as to cover the gate electrode 13B including the silicide layer 14B and the sidewall insulation films on the gate electrode 13B, and an interlayer insulation film 16 of SiO2 is formed on the SiON film 15. Further, contact holes 16A, 16B and 16C are formed in the interlayer insulation film 16 so as to expose the diffusion region 11e, the diffusion region 11f (the diffusion region 11g), and the diffusion region 11h, respectively, wherein via-plugs 17A, 17B and 17C of W (tungsten) are formed in the respective contact holes 16A, 16B and 16C via adhesive layers 17a, 17b and 17c, wherein each of the adhesive layers 17a, 17b and 17c is formed by lamination of a Ti film and a TiN film.

Further, on the interlayer insulation film 16, there is formed a first ferroelectric capacitor C1 in which a lower electrode 18A, a polycrystalline ferroelectric film 19A and an upper electrode 20A are stacked in contact with the tungsten plug 17A. Similarly, a second ferroelectric capacitor C2 is formed on the interlayer insulation film 16 by stacking of a lower electrode 18C, a polycrystalline ferroelectric film 19C and an upper electrode 20C in contact with the tungsten plug 17C.

Further, on the interlayer insulation film 16, there is formed a hydrogen barrier film 21 of Al2O3 so as to cover the ferroelectric capacitors C1 and C2, and a next interlayer insulation film 22 is formed further on the hydrogen barrier film 21.

On the interlayer insulation film 22, there is formed a next hydrogen barrier film 24 of Al2O3, and a further interlayer insulation film 25 is formed on the hydrogen barrier film 24.

Further, in the interlayer insulation film 25, there are formed a contact hole 25A exposing the upper electrode 20A of the ferroelectric capacitor C1, a contact hole 25B exposing the via-plug 17B, and a contact hole 25C exposing the upper electrode 20C of the ferroelectric capacitor C2, wherein the contact holes 25A-25C are formed respectively with tungsten plugs 23A, 23B and 23C via respective adhesion layers 23a, 23b and 23c formed by lamination of a Ti film and a TiN film.

Further, Al interconnection patterns 26A, 26B and 26C are formed on the interlayer insulation film 25 respectively in correspondence to the tungsten plugs 23A, 23B and 23C with a barrier metal film of the Ti/TiN layered structure.

With the ferroelectric memory of the construction of FIG. 1, the interlayer insulation film 22 covering the ferroelectric capacitors C1 and C2 are formed generally by a plasma CVD process that uses a source material of small water content such as TEOS. Further, the ferroelectric capacitors C1 and C2 are covered with the hydrogen barrier film 21. Even so, the problem caused by the hydrogen for the ferroelectric capacitors C1 and C2 associated with the interlayer insulation film is not completely resolved.

FIGS. 2A and 2B show a part of the fabrication process of the ferroelectric memory of FIG. 1.

Referring to FIG. 2A, the interlayer insulation film 22 is planarized by a CMP process after formation thereof, and an Al2O3 film 24 is formed on such a planarized interlayer insulation film 22 in FIG. 2B. In order to suppress the degradation of the ferroelectric capacitors C1 and C2 by reduction, it is preferable to reduce the film thickness of the interlayer insulation film 22 as much as possible in the CMP (chemical mechanical polishing) of foregoing FIG. 2A.

On the other hand, it is preferable, with the ferroelectric capacitors C1 and C2, to form the upper electrodes 20A and 20C with a conductive oxide, particularly with an IrO2 film or a RuO2 film such that there is caused no degradation of ferroelectricity in the ferroelectric capacitor by way of activation of hydrogen, even in the case hydrogen has caused invasion thereinto through the hydrogen barrier film 21. However, an IrO2 film or a RuO2 film has poor resistance against CMP, and the upper electrode 20A or 20C cannot stop the polishing process in such a case in which polishing has reached the ferroelectric capacitor C1 or C2.

Under these situations, it has been practiced conventionally to form the interlayer insulation film 22 to have a large thickness and a tolerance D of 300 nm or more is secured over the ferroelectric capacitor.

However, when the film thickness of the interlayer insulation film 22 is increased like this, there arises a problem, apart from the problem explained previously that water in the interlayer insulation film 22 causes deterioration of characteristics of the ferroelectric capacitors C1 and C2, that there is caused a significant increase of distance from the substrate 11 to the top surface of the interlayer insulation film 22, and hence to the top surface of the interlayer insulation film 25, while this leads to the problem that it is difficult to form a contact hole extending from a pattern on the interlayer insulation film 25 to the substrate 11.

SUMMARY

According to an embodiment, there is provided a semiconductor device, comprising: a first interlayer insulation film formed on a substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, the ferroelectric capacitor is formed of a lower electrode, a ferroelectric film formed on the lower electrode, an upper electrode formed on the ferroelectric film in contact therewith, and a polish-resistant film formed on the upper electrode, wherein the second interlayer insulation film covers the polish-resistant film with a film thickness of 50-100 nm.

According to another embodiment, a semiconductor device, comprising: a first interlayer insulation film formed on a substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, wherein the ferroelectric capacitor comprises a lower electrode, a ferroelectric film formed on the lower electrode, an upper electrode formed on the ferroelectric film in contact therewith, and a polish-resistant film formed on the upper electrode, a top surface of the second interlayer insulation film being coincident to a top surface of the polish-resistant film in the part covering the ferroelectric film, the first hydrogen barrier film being formed in contact with the polish-resistant film, the top surface of the second interlayer insulation film causing dishing with a depth of 20% or more with regard to a film thickness of the second interlayer insulation film, the polish-resistant film being formed of a material that shows a polishing rate equal to or smaller than one-half a polishing rate of the second interlayer insulation film when subjected to a chemical mechanical polishing process of the second interlayer insulation film.

According to another embodiment, a semiconductor wafer carrying plural semiconductor devices, each of the semiconductor devices comprising a first interlayer insulation film formed on a substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, the ferroelectric capacitor being formed of a lower electrode, a ferroelectric film formed on the lower electrode, an upper electrode formed on the ferroelectric film in contact therewith, and a polish-resistant film formed on the upper electrode, the second interlayer insulation film covering, in at least one of the plural semiconductor devices, the polish-resistant film with a film thickness of 50-100 nm, the second interlayer insulation film exposes, in at least one of the plural semiconductor device, the polish-resistant film.

Further, according to a further embodiment, there is provided a method for fabricating a semiconductor device, said semiconductor device comprising a first interlayer insulation film formed on a substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, the ferroelectric capacitor is formed of a lower electrode, a ferroelectric film formed on the lower electrode, an upper electrode formed on the ferroelectric film in contact therewith, and a polish-resistant film formed on the upper electrode, wherein the method comprises forming the second insulation film on the first insulation film so as to cover the ferroelectric capacitor, and polishing the second insulation film by a chemical mechanical polishing process such that a thickness thereof over the polish-resistant film becomes 50-100 nm.

Further, according to a further embodiment, there is provided a method for fabricating a semiconductor device, said semiconductor device comprising: a first interlayer insulation film formed on a substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, the ferroelectric capacitor comprising a lower electrode, a ferroelectric film formed on the lower electrode, an upper electrode formed on the ferroelectric film in contact therewith, and a polish-resistant film formed on the upper electrode, wherein the method comprises: forming the second interlayer insulation film on the first interlayer insulation film so as to cover the ferroelectric capacitor, and polishing the second interlayer insulation film by a chemical mechanical polishing process until the polish-resistant film is exposed, wherein the chemical mechanical polishing process is conducted such that dishing is caused at the top surface of the second interlayer insulation film with a depth of 20% or more of a film thickness of the second interlayer insulation film, the polish-resistant film being formed of a material that shows a polishing rate equal to or smaller than one-half a polishing rate of the second interlayer insulation film when subjected to a chemical mechanical polishing process of the second interlayer insulation film.

Further, according to a further embodiment, there is provided a method for manufacturing a semiconductor wafer carrying plural semiconductor devices thereon, each of the semiconductor devices comprising: a first interlayer insulation film formed on the substrate, a ferroelectric capacitor formed on the first interlayer insulation film, a second interlayer insulation film formed on the first interlayer insulation film so as to cover the ferroelectric capacitor, and a hydrogen barrier film formed on the second interlayer insulation film, the ferroelectric capacitor being formed of a lower electrode, a ferroelectric film formed on the lower electrode, an upper electrode formed on the ferroelectric film in contact therewith, and a polish-resistant film formed on the upper electrode, the method comprises forming the second interlayer insulation film on the first interlayer insulation film so as to cover the ferroelectric capacitor of each semiconductor device, conducting a chemical mechanical polishing process to the second interlayer insulation film such that the second interlayer insulation film has a thickness of 50-100 nm over the polish-resistant film in at least one of the plural semiconductor devices, the chemical mechanical polishing process is conducted such that the polish-resistant film is exposed from the second interlayer insulation film in at least one of the plural semiconductor devices.

According to the embodiments discussed herein, it becomes possible, as a result of formation of the second interlayer insulation film such that the second interlayer insulation film covers a polish-resistant film with a film thickness of 50-100 nm, to avoid formation of a defective semiconductor device at the time of reducing the film thickness of the second interlayer insulation film by a CMP process conducted after the film formation thereof, even in such a case that the polishing has become excessive and reached the ferroelectric capacitor underneath the second interlayer insulation film. Thereby, there is caused no degradation of yield. Thus, it becomes possible to reduce the film thickness of the second interlayer insulation film to the state immediately before exposure of the polish-resistant film, without a concern of formation of defective devices, and it becomes possible to reduce the amount of water, which causes degradation of characteristics when incorporated into the ferroelectric capacitor. Further, as a result of such reduction of the film thickness of the second interlayer insulation film, the depth of the contact holes formed in the interlayer insulation film is decreased also, and fabrication of the semiconductor device is facilitated.

Further, according to the embodiments discussed herein, it becomes possible to intentionally cause a large amount of dishing in the second interlayer insulation film with a depth corresponding to 20% or more of the film thickness of the second interlayer insulation film by forming the polish-resistant film on the upper electrode of the ferroelectric capacitor. Thereby, it becomes possible to reduce the film thickness, and hence volume, of the second interlayer insulation film in the region outside the region where the ferroelectric capacitor is formed. As a result, it becomes possible to reduce the amount of water that causes degradation of characteristics when incorporated into the ferroelectric capacitor. Further, as a result of such reduction of the film thickness of the second interlayer insulation film, the depth of the contact holes formed in the interlayer insulation film is decreased also, and fabrication of the semiconductor device is facilitated.

BRIEF DESCRIPTION OF THE DRAWINGS

FIG. 3O illustrates a (15th) diagram describing the fabrication process of the ferroelectric memory according to the first embodiment.

DETAILED DESCRIPTION OF THE EMBODIMENTS

First Embodiment

The fabrication process of a ferroelectric memory according to a first embodiment will be described with reference to FIGS. 3A-3U.

Figure 1:
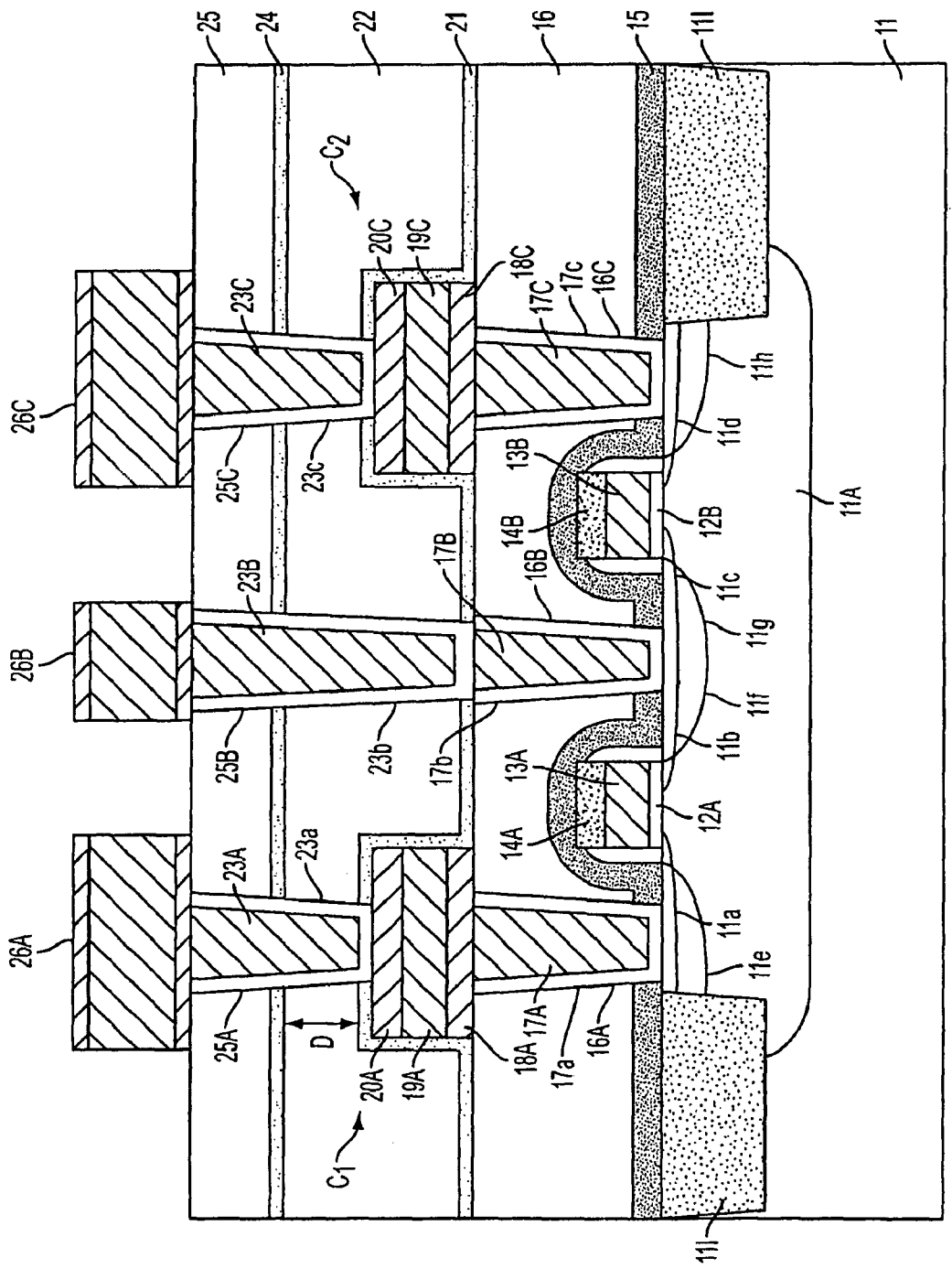
FIG. 1 illustrates the construction of a ferroelectric memory according to a related art.
Figure 2A:
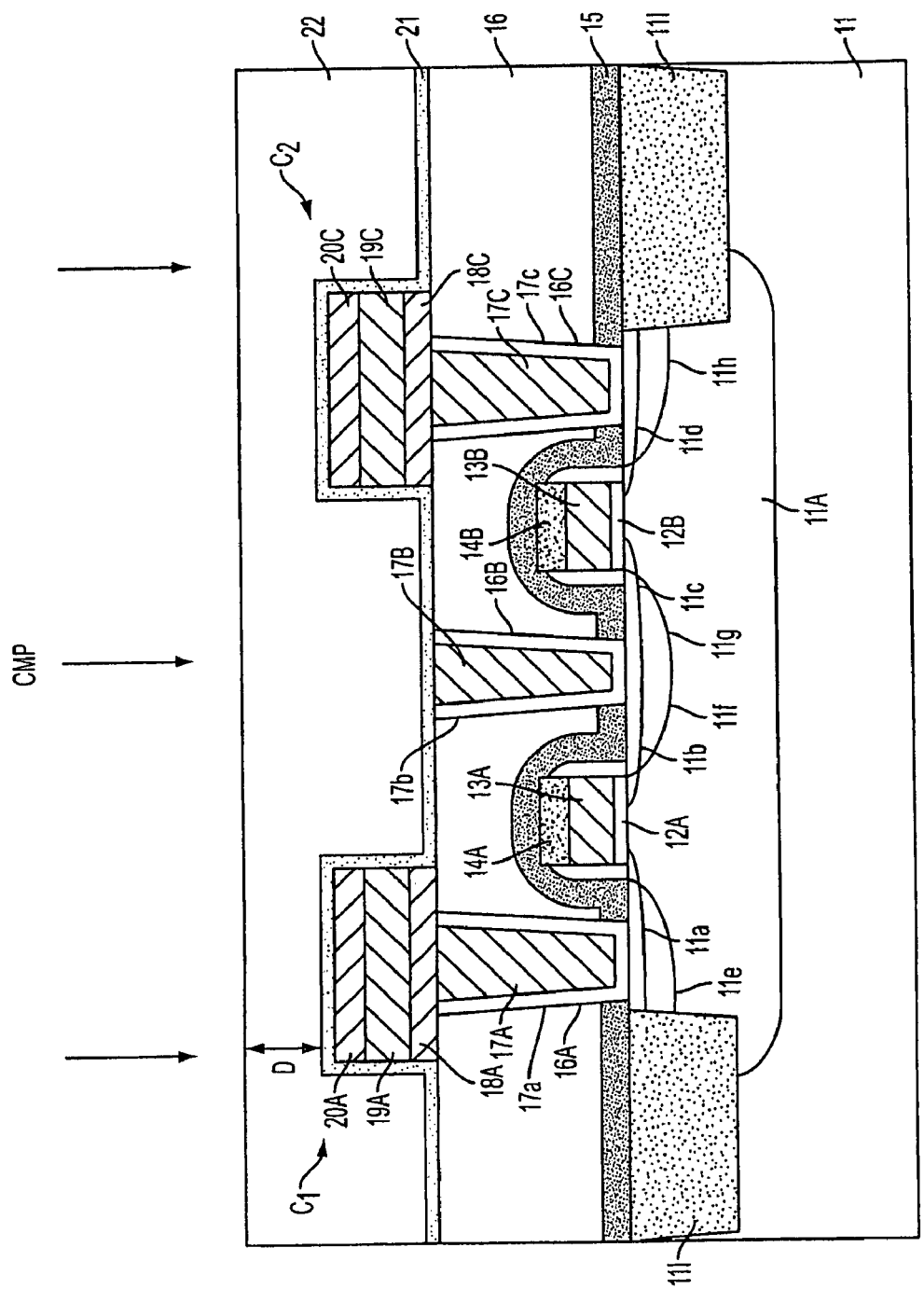
FIG. 2A illustrates a part of the fabrication process of the ferroelectric memory of FIG. 1.
Figure 2B:
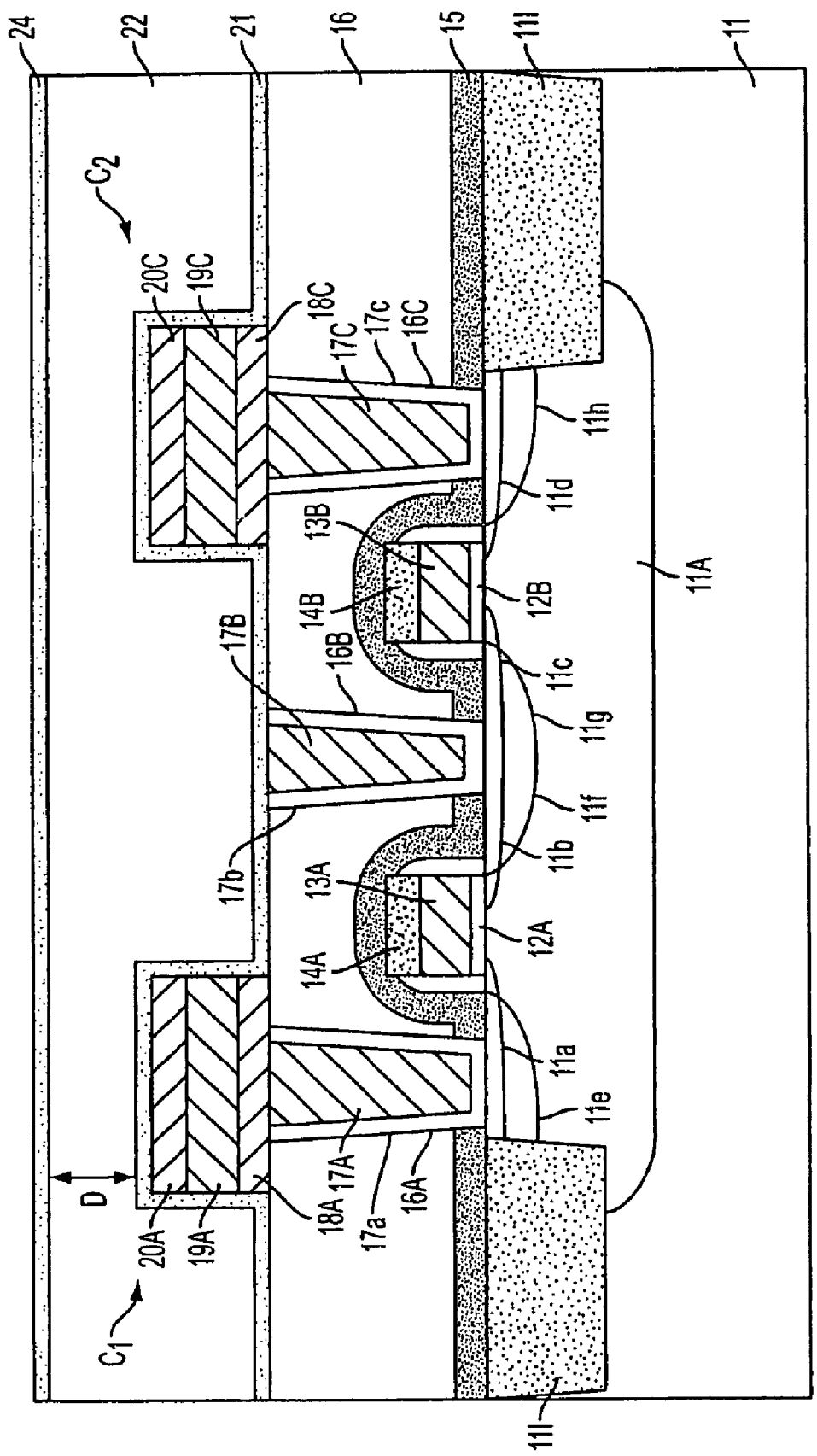
FIG. 2B illustrates a part of the fabrication process of the ferroelectric memory of FIG. 1.
Figure 3A:
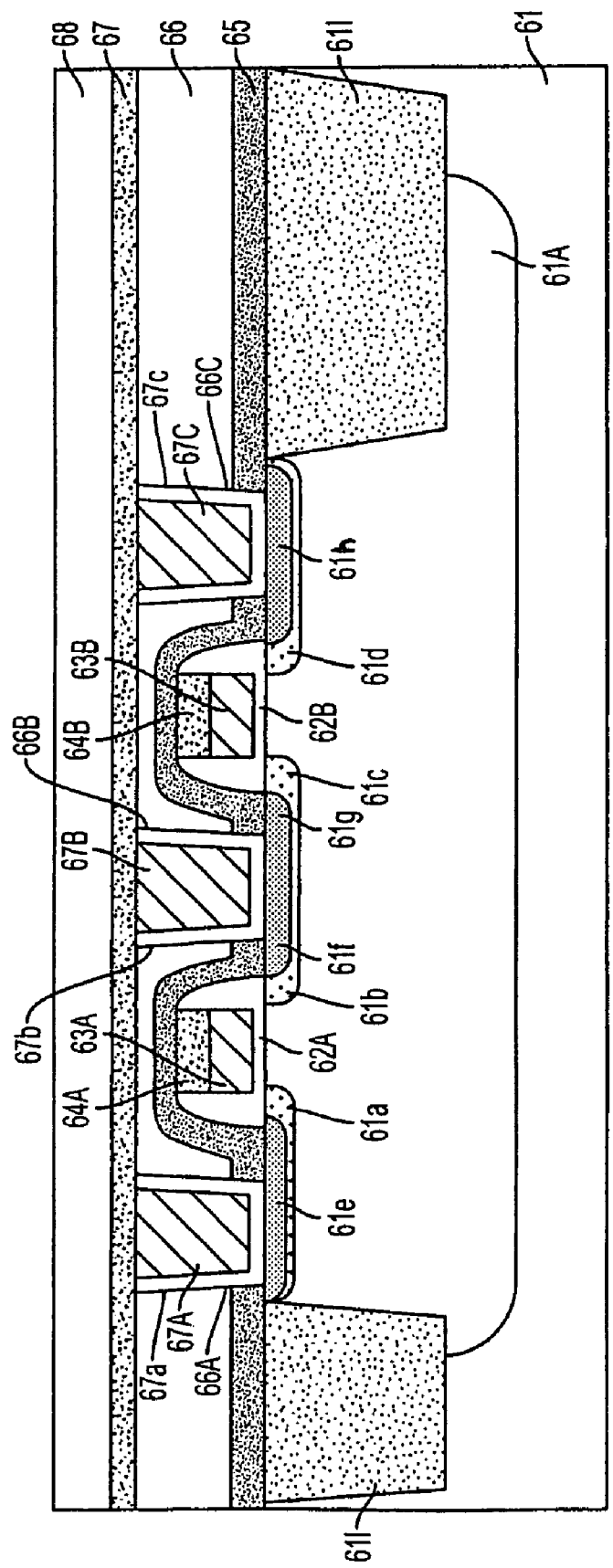
FIG. 3A illustrates illustrates a (1st) diagram describing the fabrication process of a ferroelectric memory according to a first embodiment.

Referring to FIG. 3A, there is formed an n-type well in a silicon substrate 61 as a device region 61A, wherein there is formed, on the device region 61A, a first MOS transistor having a polysilicon gate electrode 63A and a second MOS transistor having a polysilicon gate electrode 63B via respective gate insulation films 62A and 62B.

Further, in the silicon substrate 61, there are formed LDD regions 61a and 61b of p--type in correspondence to respective sidewalls of the gate electrode 63A, and there are further formed LDD regions 61c and 61d of p--type in correspondence to respective sidewalls of the gate electrode 63B. Thereby, the first and second MOS transistors are formed commonly in the device region 61A, and thus, the same p-type diffusion region is used as the LDD region 61b and the LDD region 61c.

On the polysilicon gate electrodes 63A and 63B, there are formed silicide layers 64A and 64B, respectively, and there are further formed sidewall insulation films on the sidewall surfaces of the polysilicon gate electrode 63A and on the sidewall surfaces of the polysilicon gate electrode 63B, respectively.

Furthermore, diffusion regions 61e and 61f of p+-type are formed in the silicon substrate 61 at respective outer sides of the sidewall insulation films of the gate electrode 63A, and diffusion regions 61g and 61h of p+-type are formed in the silicon substrate 61 at respective outer sides of the sidewall insulation films of the gate electrode 63B. Thereby, the diffusion regions 61f and 61g are formed by the same p+-type diffusion region.

Further, on the silicon substrate 61, there is formed an SiON film 65 so as to cover the gate electrode 63A including the silicide layer 64A and the sidewall insulation films of the gate electrode 63A and so as to cover the gate electrode 63B including the silicide layer 64B and the sidewall insulation films on the gate electrode 63B, and an interlayer insulation film 66 of SiO2 is formed on the SiON film 65 by a plasma CVD process that uses TEOS for the source material with a thickness of 100 nm, for example. Further, the interlayer insulation film 66 is planarized by a CMP process, and contact holes 66A, 66B and 66C are formed in the interlayer insulation film 66 so as to expose the diffusion regions 61e, 61f (and thus the diffusion region 61g) and 61h, respectively. In the contact holes 66A, 66B and 66C, there are formed via plugs 67A, 67B and 67C respectively via respective adhesion layers 67a, 67b and 67c, wherein each adhesion layer is formed of lamination of a Ti film of the thickness of 30 nm and a TiN film of the thickness of 20 nm.

Further, with FIG. 3A, it should be noted that there is formed a next interlayer insulation film 68 of a silicon oxide film on the interlayer insulation film 66 with a thickness of 300 nm, for example, via another SiON film 67 of the thickness of 130 nm for example, by a plasma CVD process that uses TEOS for the source material similarly to the interlayer insulation film 66. Again, it is possible to use an SiN film or Al2O3 film in place of the SiON film 67.

Figure 3B:
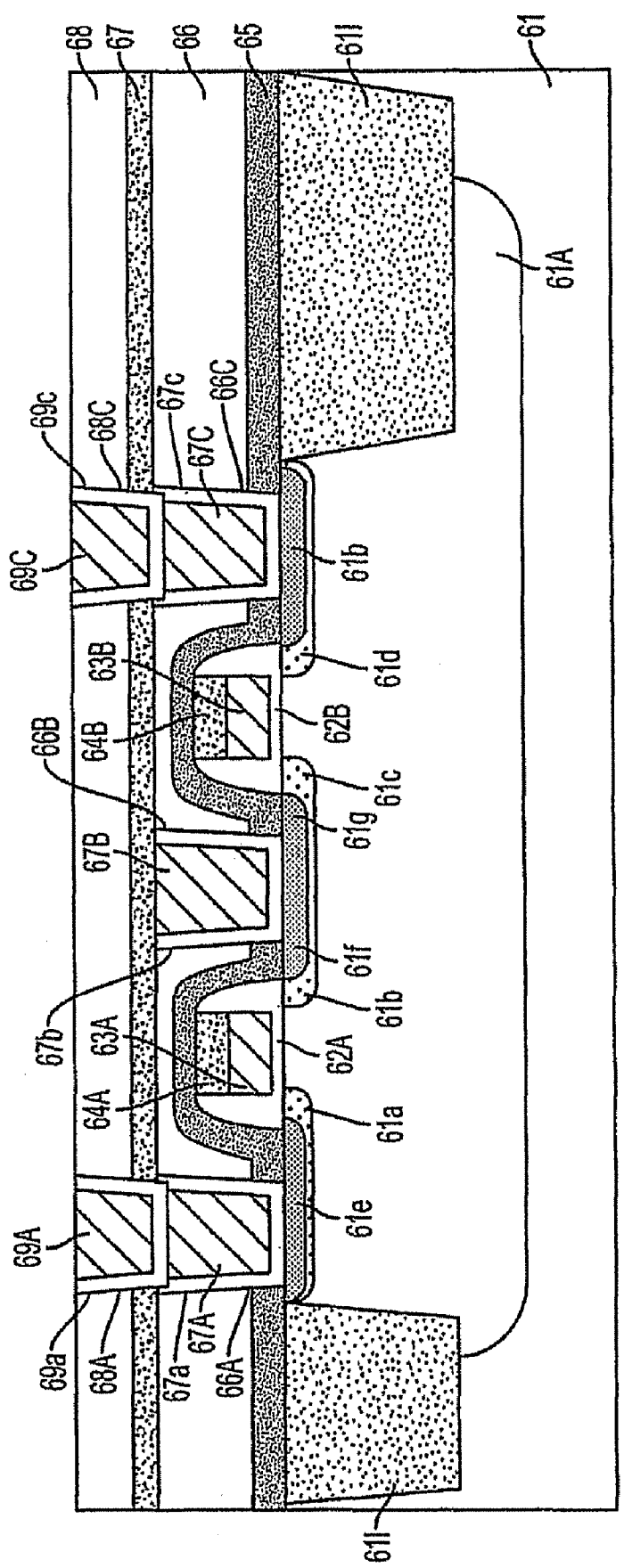
FIG. 3B illustrates a (2nd) diagram describing the fabrication process of the ferroelectric memory according to the first embodiment.

Next, in FIG. 3B, via holes 68A and 68C are formed in the interlayer insulation film 68 for exposing the via-plugs 67A and 67C, and a via-plug 69A of tungsten is formed in the via-hole 68A so as to make a contact with the via-plug 67A via an adhesion layer 69a in which a Ti film and a TiN film are laminated similarly to the adhesion film 67a. Further, in the via-hole 68C, there is formed a via-plug 69C of tungsten in contact with the via-plug 67C via an adhesion layer 69c in which a Ti film and a TiN film are laminated similarly to the case of the adhesion film 67c.

Figure 3C:
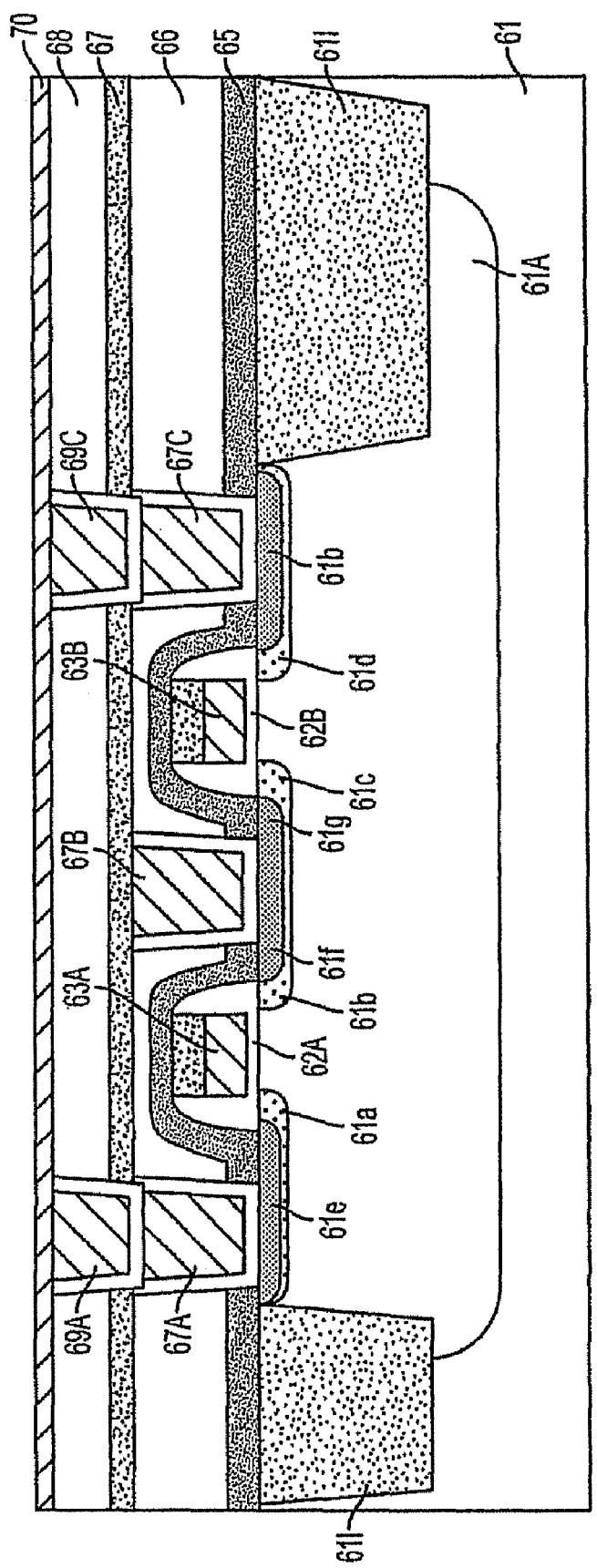
FIG. 3C illustrates a (3rd) diagram describing the fabrication process of the ferroelectric memory according to the first embodiment.

Next, in FIG. 3C, the surface of the interlayer insulation film 68 is processed with NH3 plasma such that NH groups cause bonding with the oxygen atoms at the surface of the interlayer insulation film 68. Next, a Ti film 70 is formed on the interlayer insulation film 68 by a sputtering process with a thickness of 20 nm, for example, such that the Ti film 70 covers the via-plugs 69A and 69C. By processing the surface of the interlayer insulation film 68 with such NH3 plasma, the oxygen atoms at the surface of the interlayer insulation film 68 are terminated by the NH groups, and thus, the Ti atoms deposited on the interlayer insulation film experience no orientation control of the oxygen atoms. Thus, the Ti layer 70 shows an ideal (002) orientation.

Further, with FIG. 3C, the Ti film 70 is subjected to a rapid thermal annealing process in a nitrogen gas ambient at the temperature of 650° C., and the Ti film 70 is converted to a TiN film 70 of a (111) orientation.

Figure 3D:
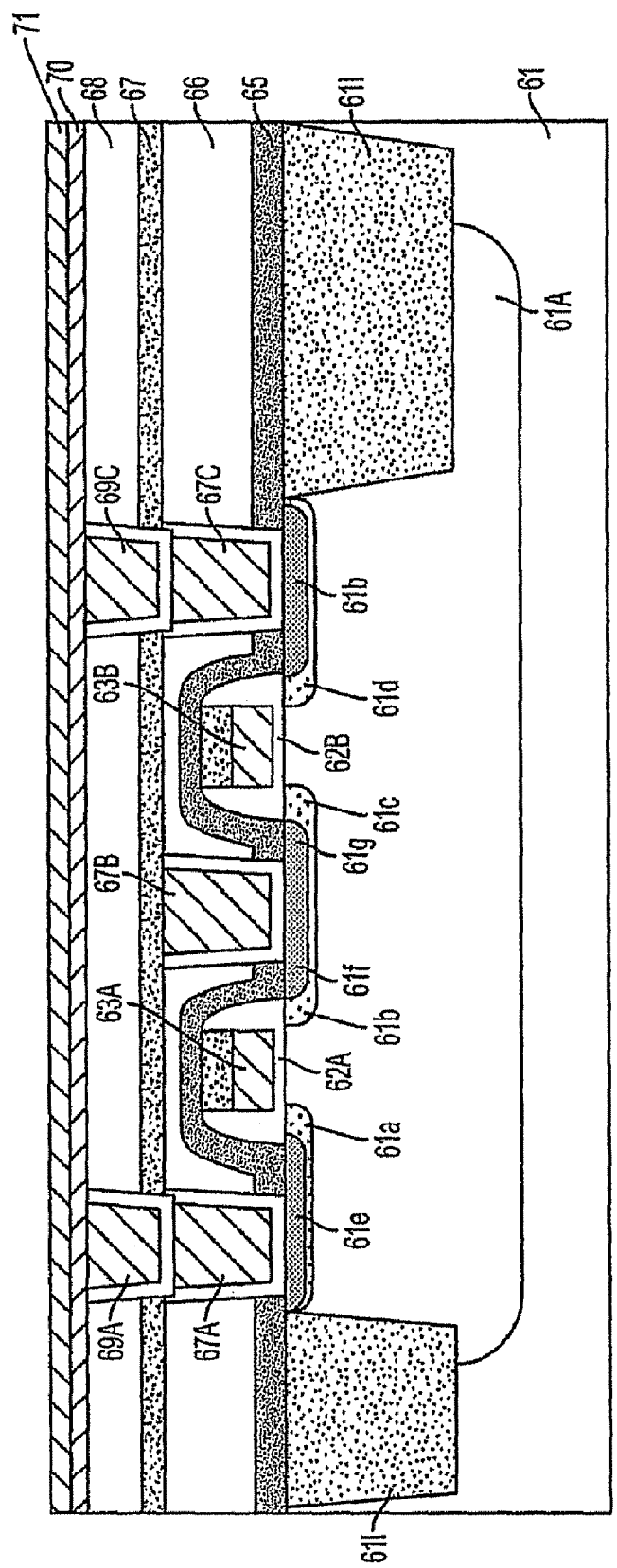
FIG. 3D illustrates a (4th) diagram describing the fabrication process of the ferroelectric memory according to the first embodiment.
Figure 3E:
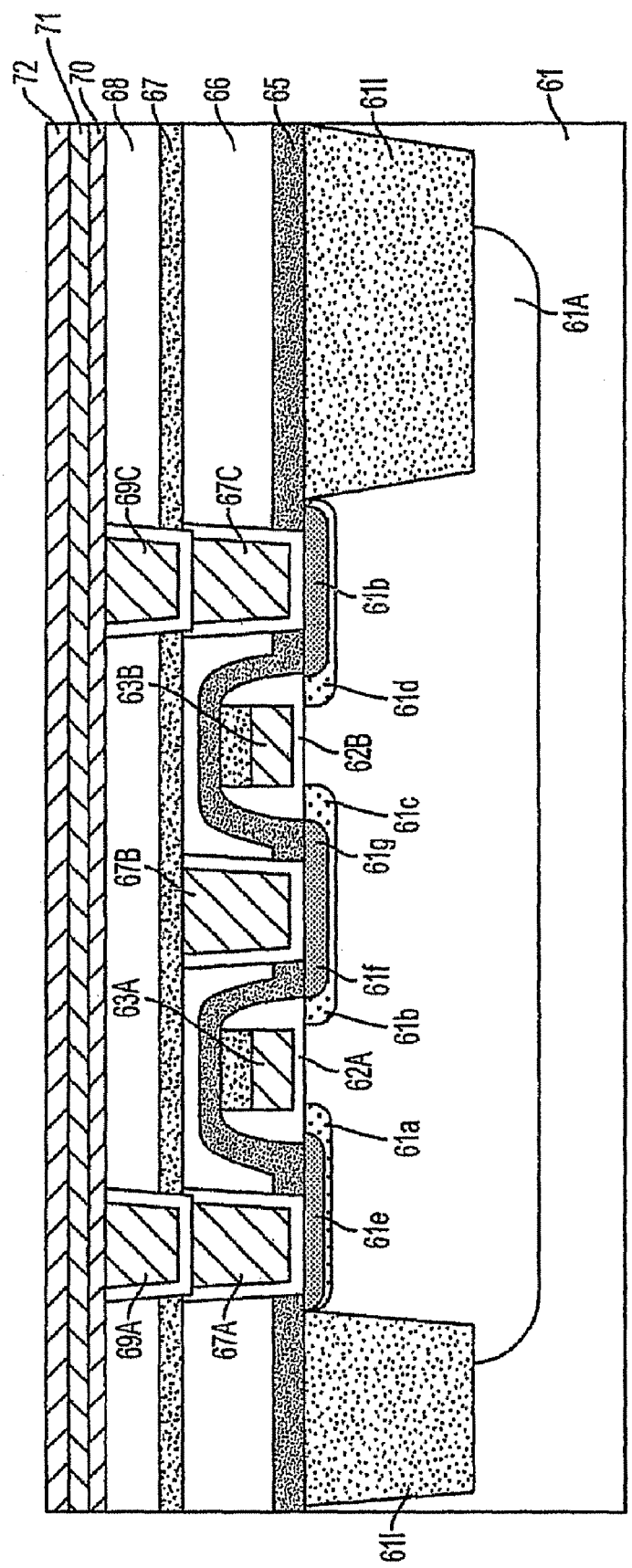
FIG. 3E illustrates a (5th) diagram describing the fabrication process of the ferroelectric memory according to the first embodiment.

Next, in FIG. 3D, a TiAlN film 71 is formed on the TiN film 70 as an oxygen diffusion barrier, and an Ir film of the thickness of 50-100 nm, an IrOx film of the thickness of 30 nm, and a Pt film of the thickness of 50 nm are laminated on the TiAlN film 71 in FIG. 3E by a sputtering process. With this, a lower electrode layer 72 is formed.

Figure 3F:
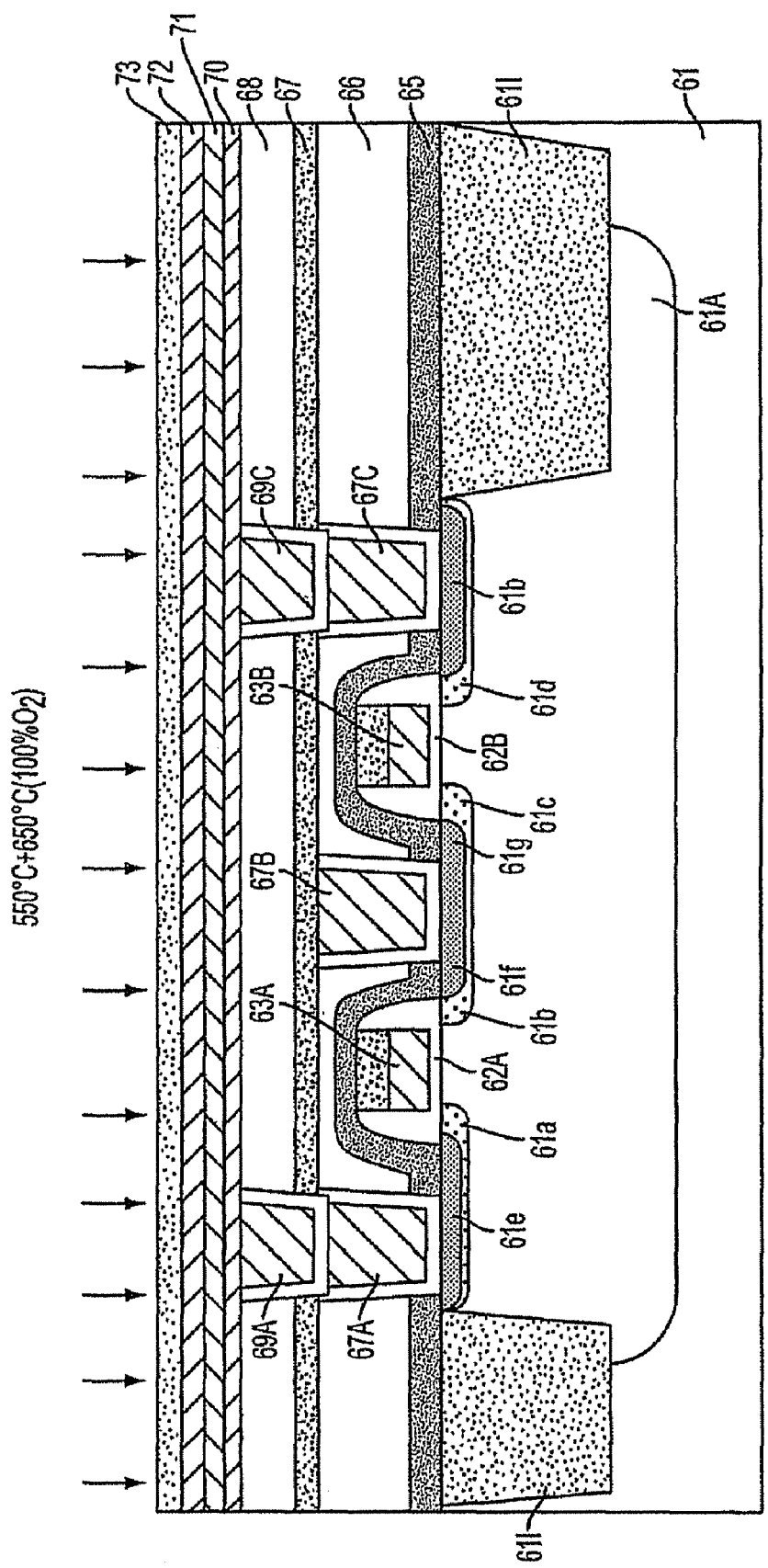
FIG. 3F illustrates a (6th) diagram describing the fabrication process of the ferroelectric memory according to the first embodiment.

Next, the structure of FIG. 3E is annealed in an Ar gas ambient for 60 seconds at a temperature of 650° C. or higher similarly to the previous embodiment, and a PZT film 73 is formed on the lower electrode layer 72 in FIG. 3F by a sputtering process with a thickness of 120 nm, for example.

In FIG. 3F, the PZT film 73 thus obtained in the amorphous phase is annealed at a temperature of 550° C. for 30-120 seconds while causing an oxygen gas to flow with a flow rate of 1000 sccm and an Ar gas with 1000 sccm. As a result, the PZT film 73 undergoes crystallization.

As a result of this crystallization annealing process, there is caused a growth of columnar PZT crystals with a (111) orientation in the PZT films 73 in the upward direction from the surface of the lower electrode 72.

In the embodiments, the ferroelectric film is not limited to a PZT film, and it is possible to use a PZT film or PLZT film in which at least one of La, Ca, Sr and Si is doped, a BLT ((Bi,La)4Ti3O12) film, and a Bi layered structure compound such as (Bi1-xRx)Ti3O12 (R being a rare earth element, 0<x<1), SrBi2Ta2O9, SrBi4Ti4O15, or the like.

Further, in FIG. 3F, detected oxygen in the PZT film is compensated by conducting a thermal annealing process after the crystallization step in a 100% oxygen gas ambient at 650° C.

Figure 3G:
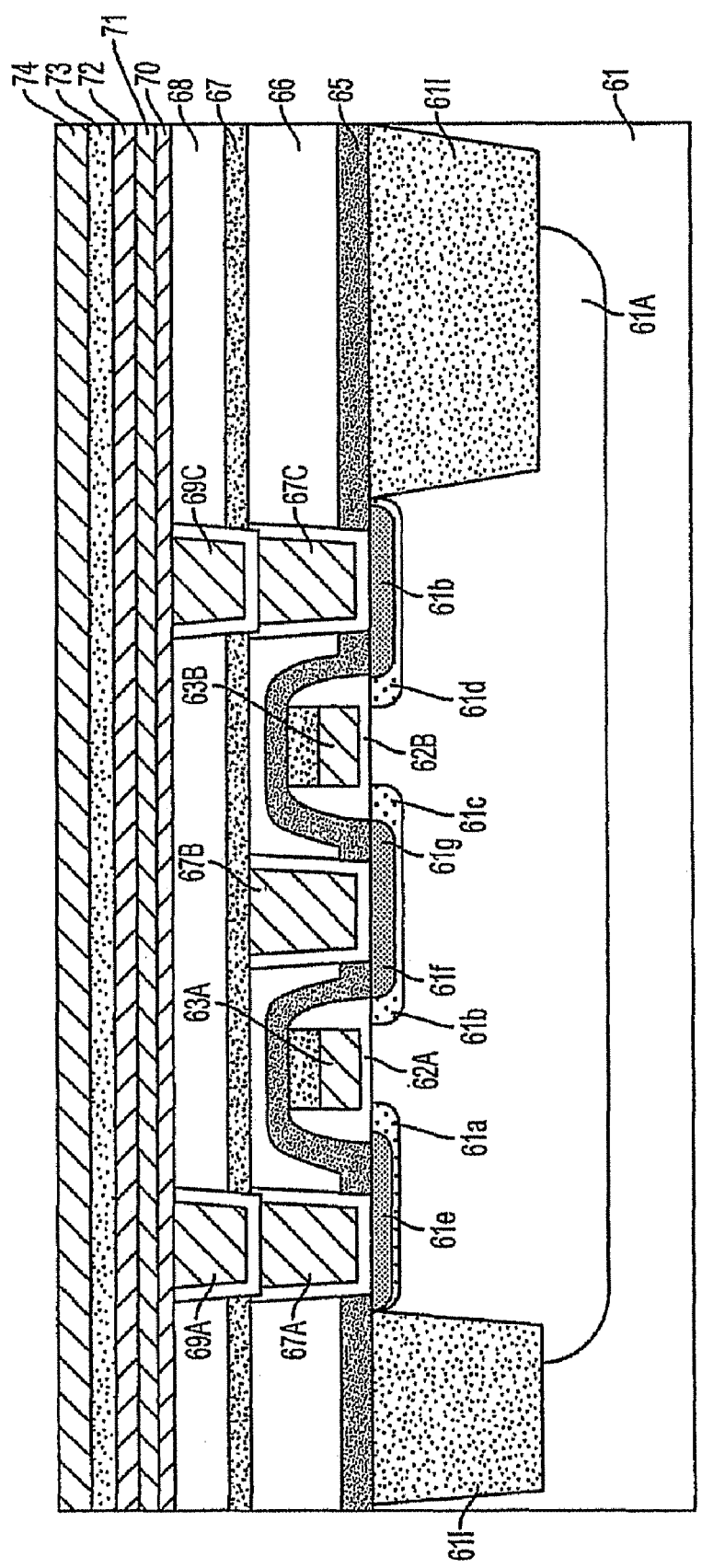
FIG. 3G illustrates a (7th) diagram describing the fabrication process of the ferroelectric memory according to the first embodiment.

Next, in FIG. 3G, an upper electrode film 74 is formed on the PZT film 73 by a sputtering process.

Figure 3H:
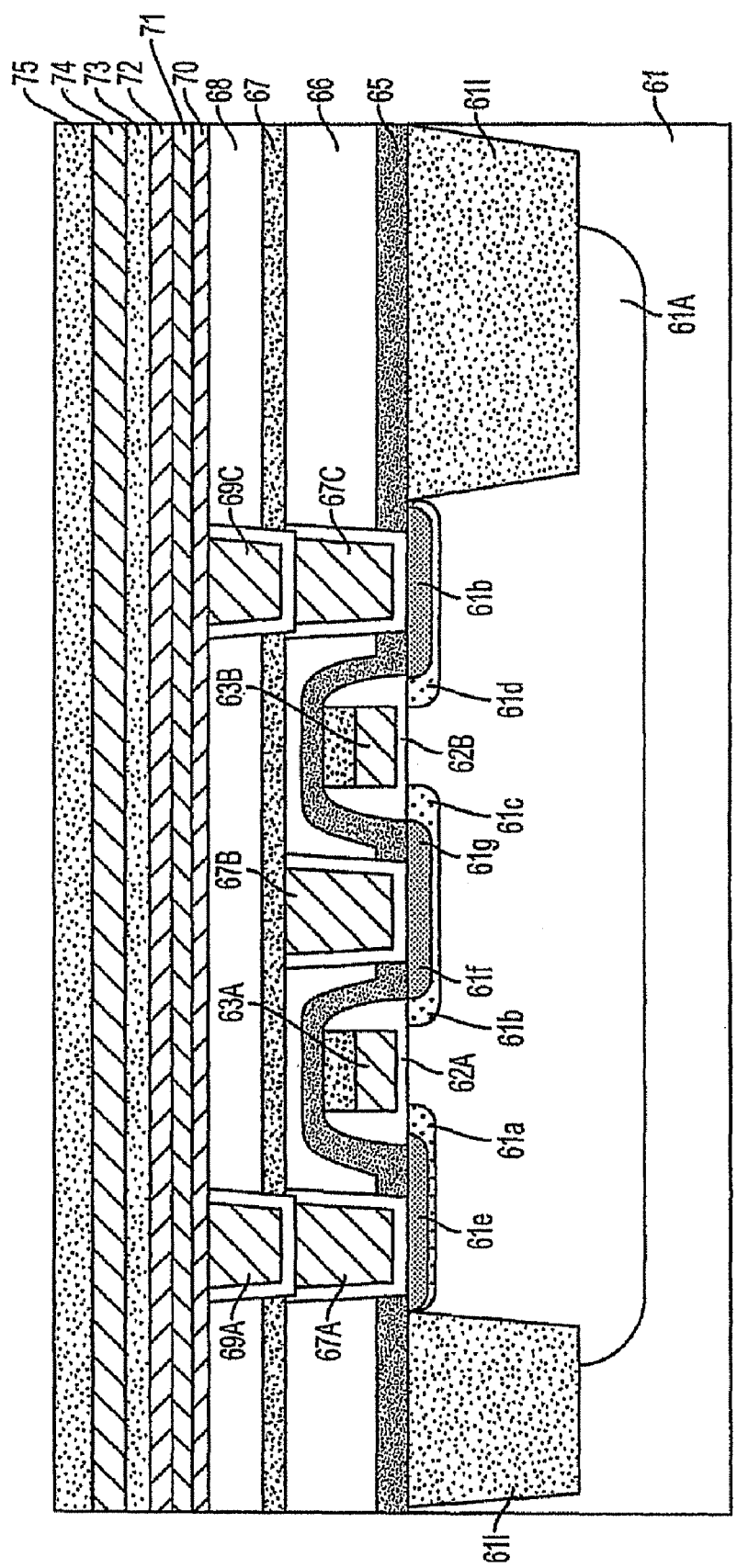
FIG. 3H illustrates a (8th) diagram describing the fabrication process of the ferroelectric memory according to the first embodiment.

With the present embodiment, a conductive polish-resistant film 75 of a Pt film, an Ir film, a SrRuO3 film, or the like, is formed further in FIG. 3H on the upper electrode 74 with a film thickness of typically 50-100 nm. For the polish-resistant film 75, it is also possible to use a Ti film, a TiW film, a W film, an Al film, or the like.

Figure 3I:
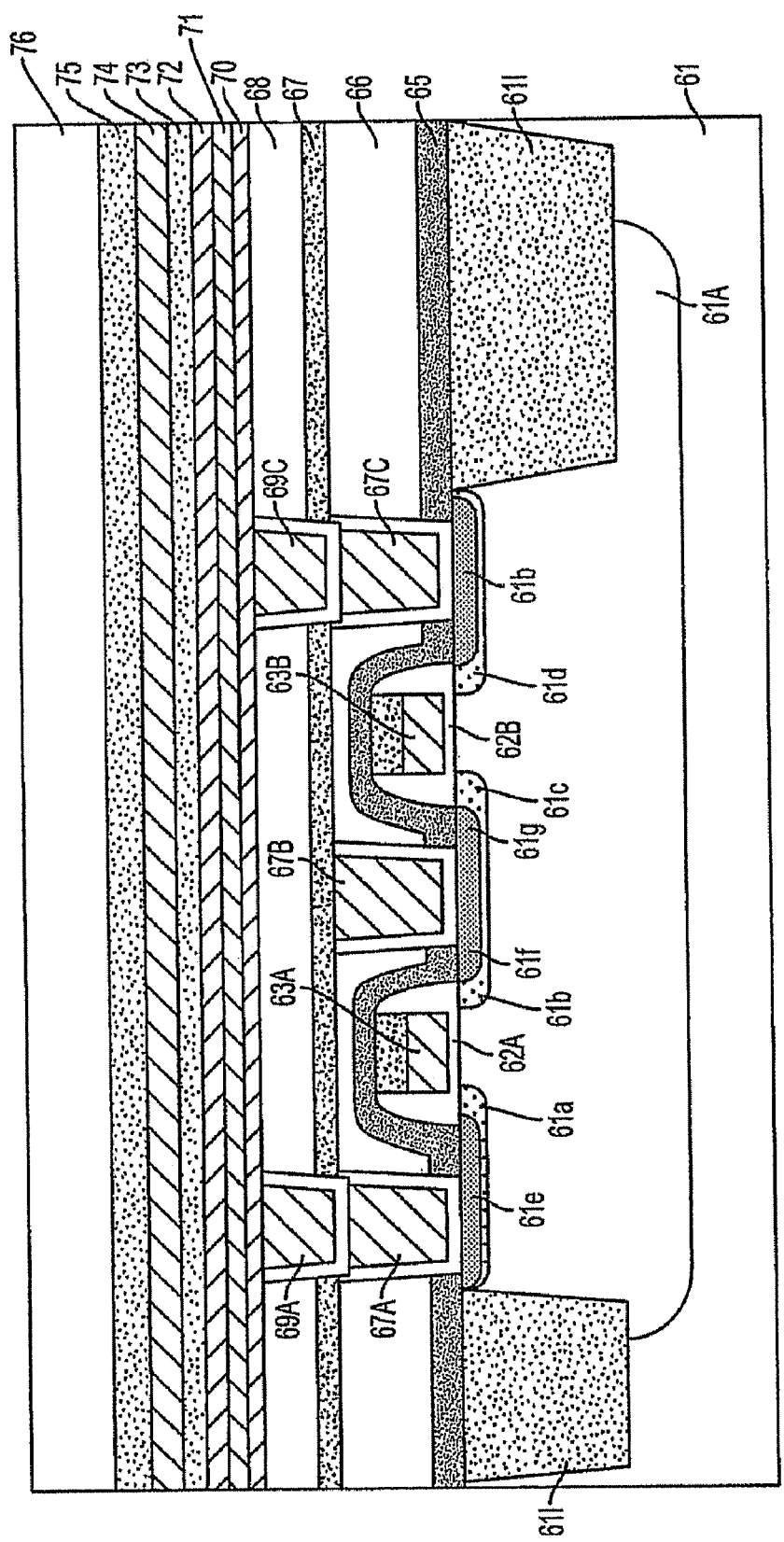
FIG. 3I illustrates a (9th) diagram describing the fabrication process of the ferroelectric memory according to the first embodiment.
Figure 3J:
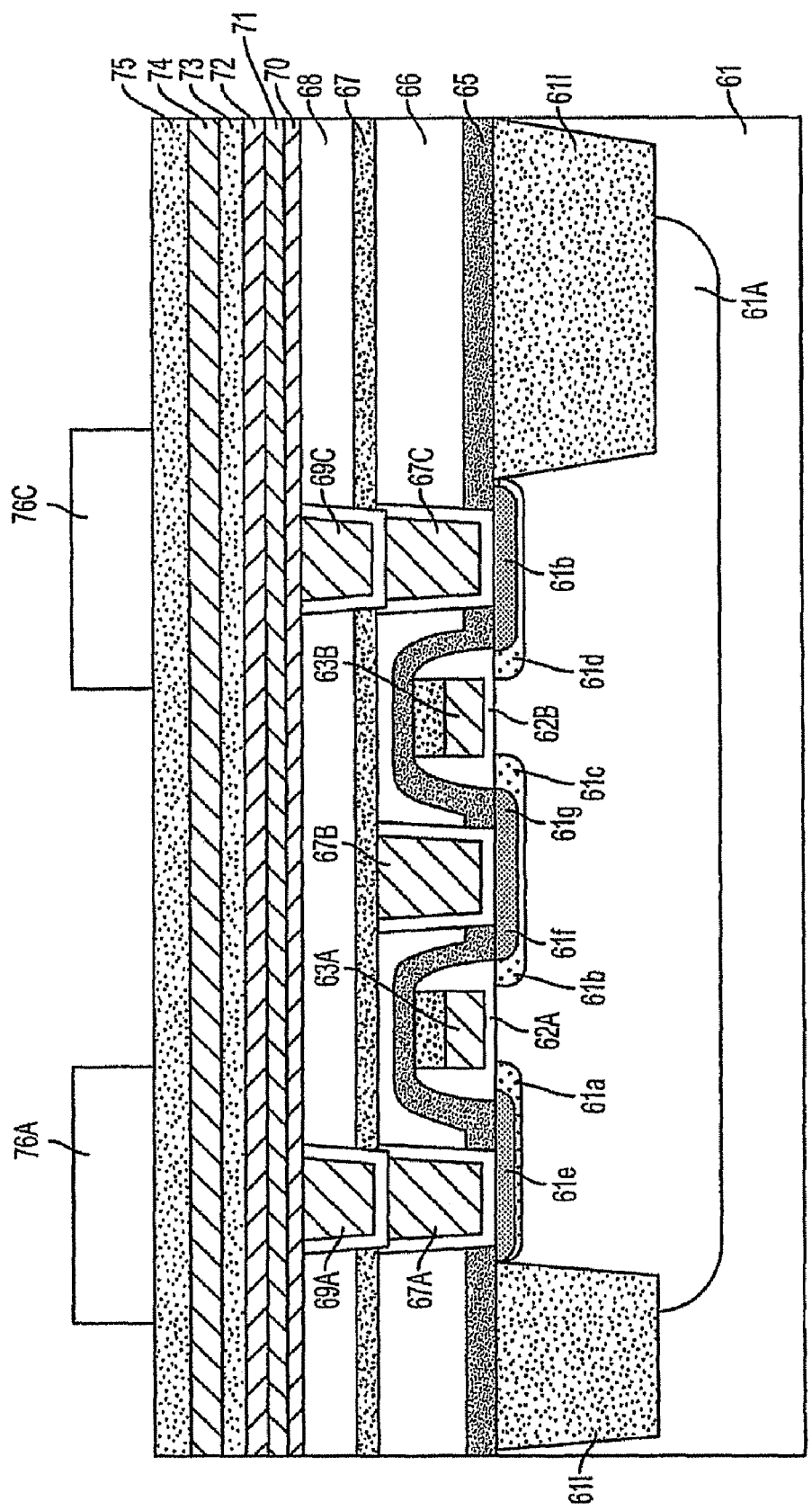
FIG. 3J illustrates a (10th) diagram describing the fabrication process of the ferroelectric memory according to the first embodiment.

Next, in FIG. 3I, a silicon oxide film 76 is formed on the polish-resistant film 75 by a plasma CVD process that uses a TEOS source material as a hard mask layer, and hard mask patterns 76A and 76C corresponding to the desired ferroelectric capacitors C1 and C2 are formed in FIG. 3J as a result of the patterning of the silicon oxide film 76.

Figure 3K:
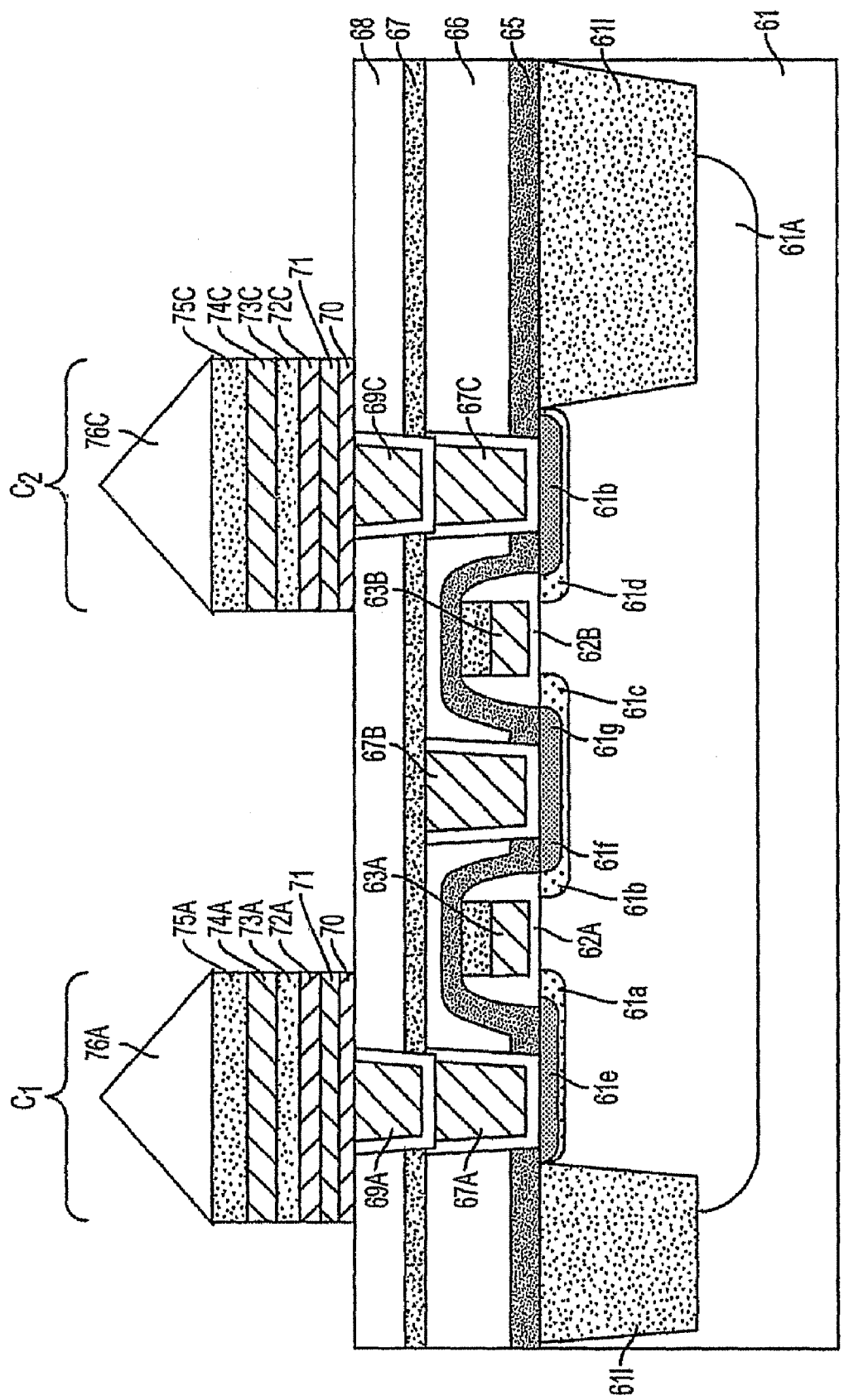
FIG. 3K illustrates a (11th) diagram describing the fabrication process of the ferroelectric memory according to the first embodiment.

Further, in FIG. 3K, the polish-resistant film 75, the upper electrode layer 74, the PZT film 73 and the lower electrode layer 72 are patterned while using the hard mask patterns 76A and 76C as a mask by a dry etching process that uses HBr, O2, Ar and C4F8, until the interlayer insulation film 68 is exposed. As a result, there is formed a structure in which a lower electrode pattern 72A, a PZT pattern 73A, an upper electrode pattern 74A and a polish-resistant film pattern 75A are formed under the hard mask pattern 76A in correspondence to the ferroelectric capacitor C1. Further, there is formed a structure in which a lower electrode pattern 72C, a PZT pattern 73C, a upper electrode pattern 74C and a polish-resistant film pattern 75C are formed under the hard mask pattern 76C in correspondence to the ferroelectric capacitor C2. Here, it should be noted that the lower electrode pattern 72A, the PZT pattern 73A and the upper electrode pattern 74A constitute the ferroelectric capacitor C1, while the lower electrode pattern 72C, the PZT pattern 73C and the upper electrode pattern 74C constitute the ferroelectric capacitor C2.

Here, the polish-resistant film patterns 75A and 75C may be regarded as a part of the underlying upper electrodes 74A and 74C, respectively. Particularly, in the case the upper electrode patterns 74A and 74C are formed of a conductive oxide film such as an IrOx film or a RuOx film and the polish-resistant films 75A and 75C are formed of a metal film of Ir or Ru, it is also possible to change the composition continuously from the upper electrode pattern 74A to the polish-resistant film pattern 75A or from the upper electrode pattern 74C to the polish-resistant film pattern 75C.

Figure 3L:
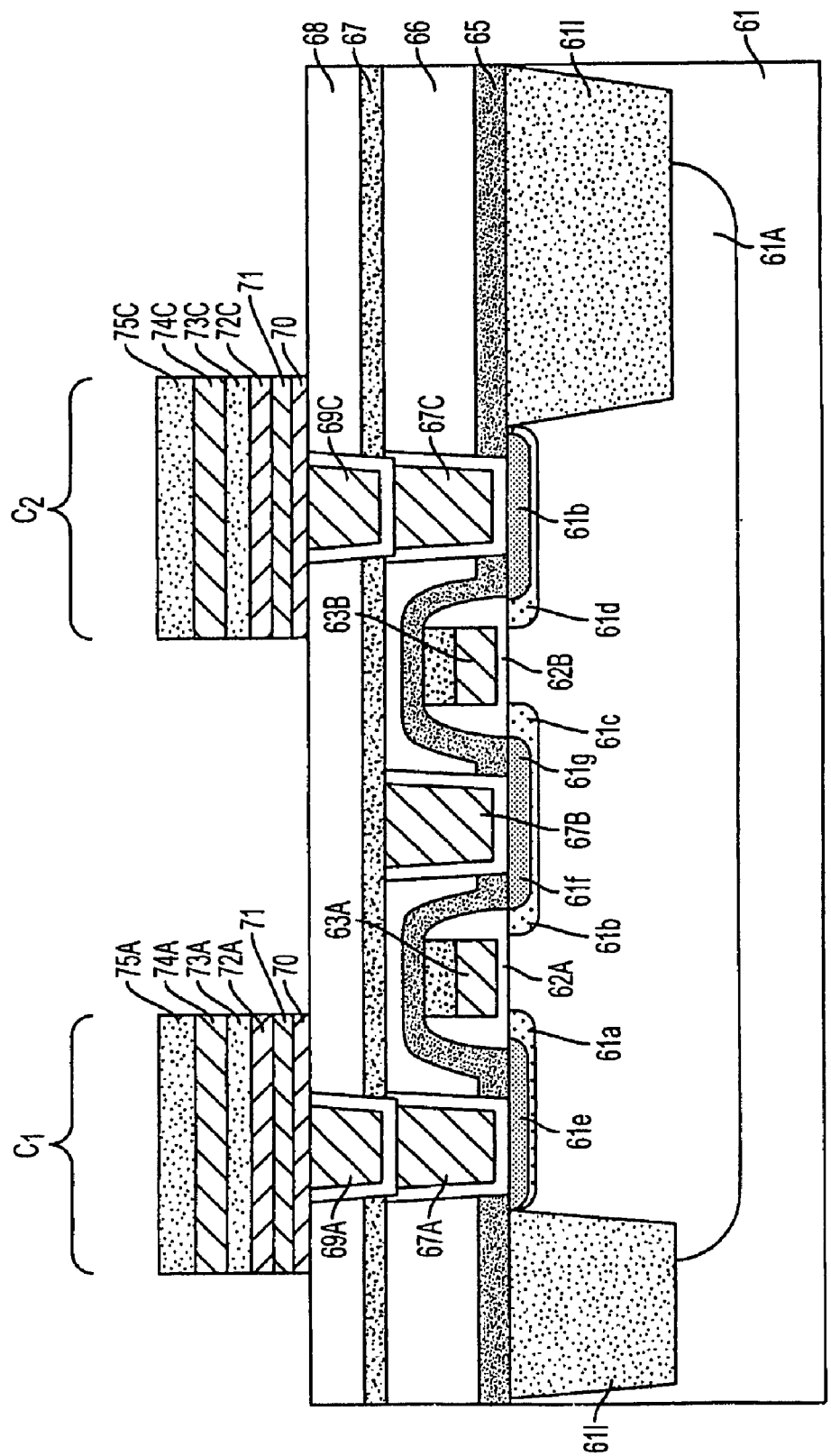
FIG. 3L illustrates a (12th) diagram describing the fabrication process of the ferroelectric memory according to the first embodiment.
Figure 3M:
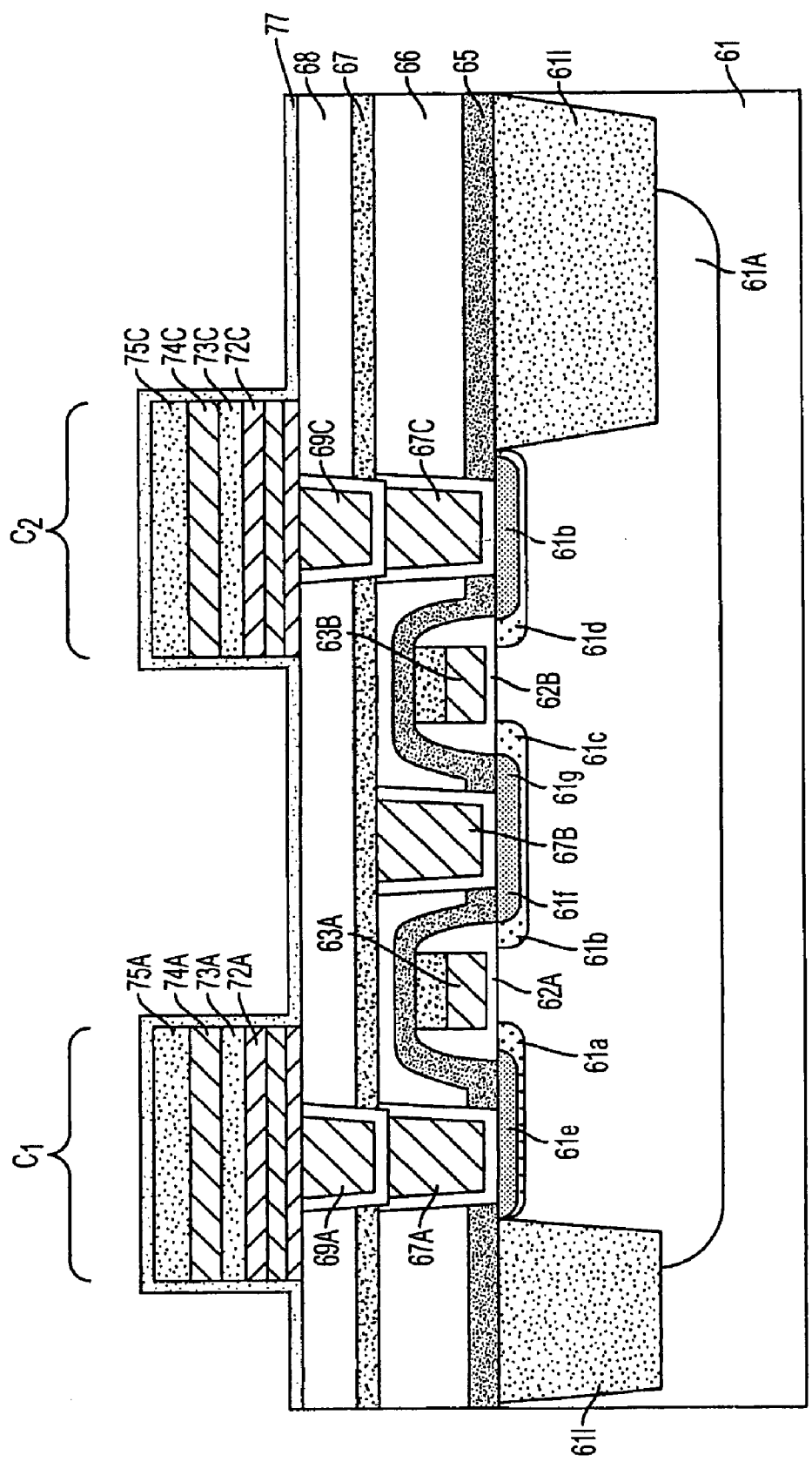
FIG. 3M illustrates a (13th) diagram describing the fabrication process of the ferroelectric memory according to the first embodiment.

Next, in FIG. 3L, the hard mask patterns 76A and 76C are removed by a dry etching process or wet etching process, and in FIG. 3M, an extremely thin Al2O3 film is formed on the interlayer insulation film 68 as a hydrogen barrier film by a sputtering process or ALD process with a thickness of 20 nm or less so as to cover the sidewall surface and top surface of the ferroelectric capacitors C1 and C2 continuously. Further, in FIG. 3N, the damages formed in the PZT films 73A and 73C of the ferroelectric capacitors C1 and C2 during the dry etching process of FIG. 3K are recovered in FIG. 3N by conducting a thermal annealing process in an oxygen gas ambient at 550-750° C. such as 650° C.

Figure 3N:
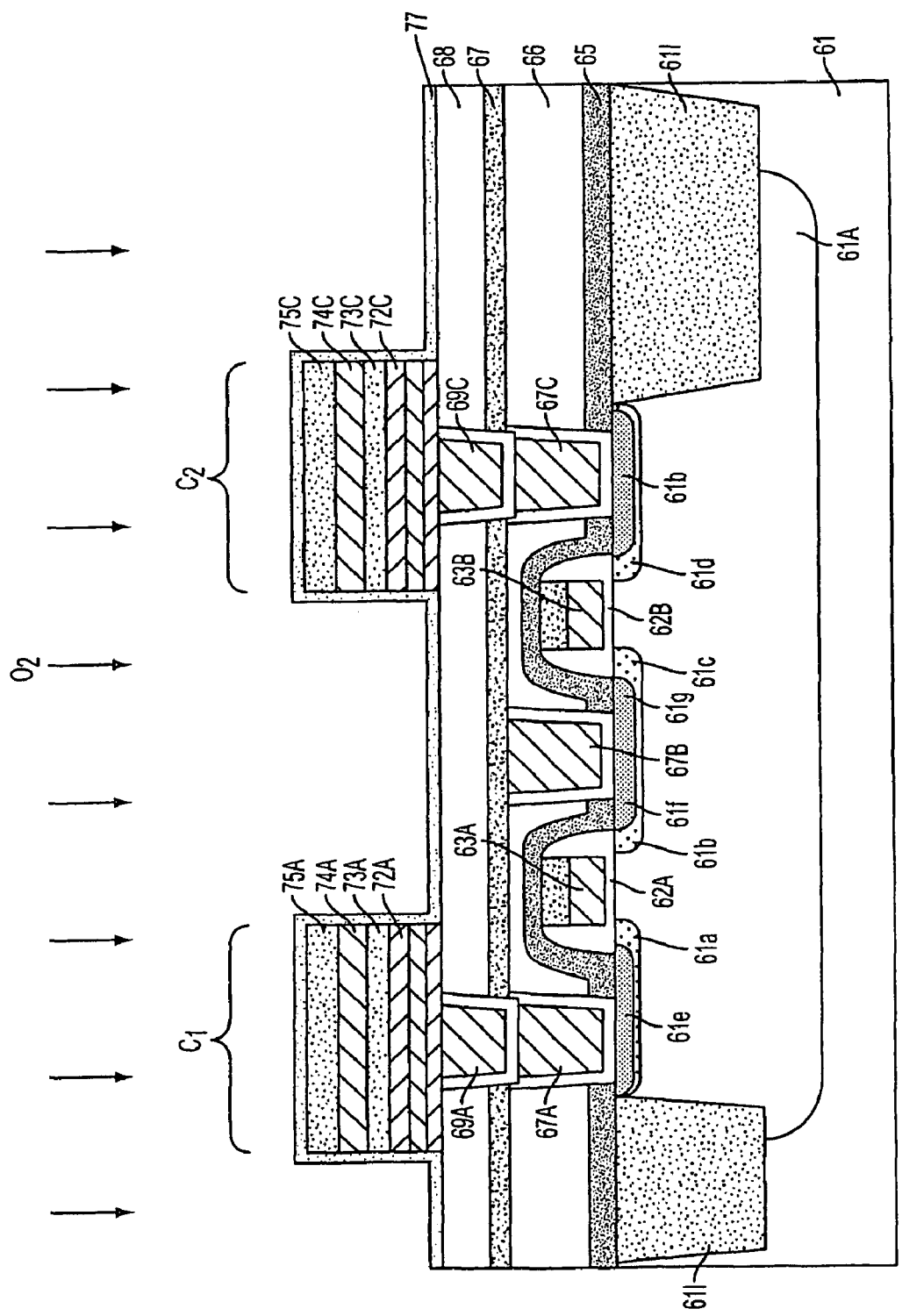
FIG. 3N illustrates a (14th) diagram describing the fabrication process of the ferroelectric memory according to the first embodiment.
Figure 30:
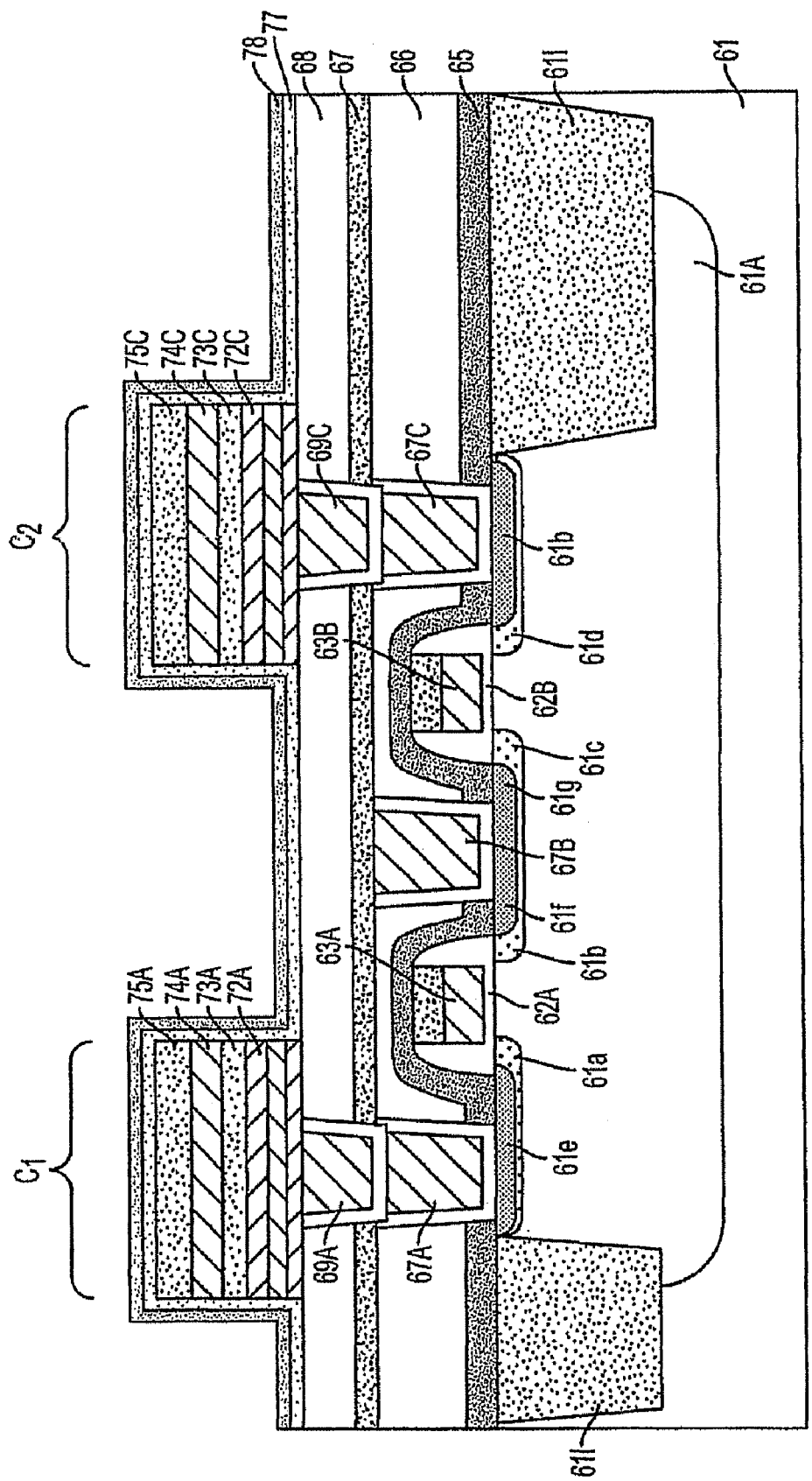
Figure 3P:
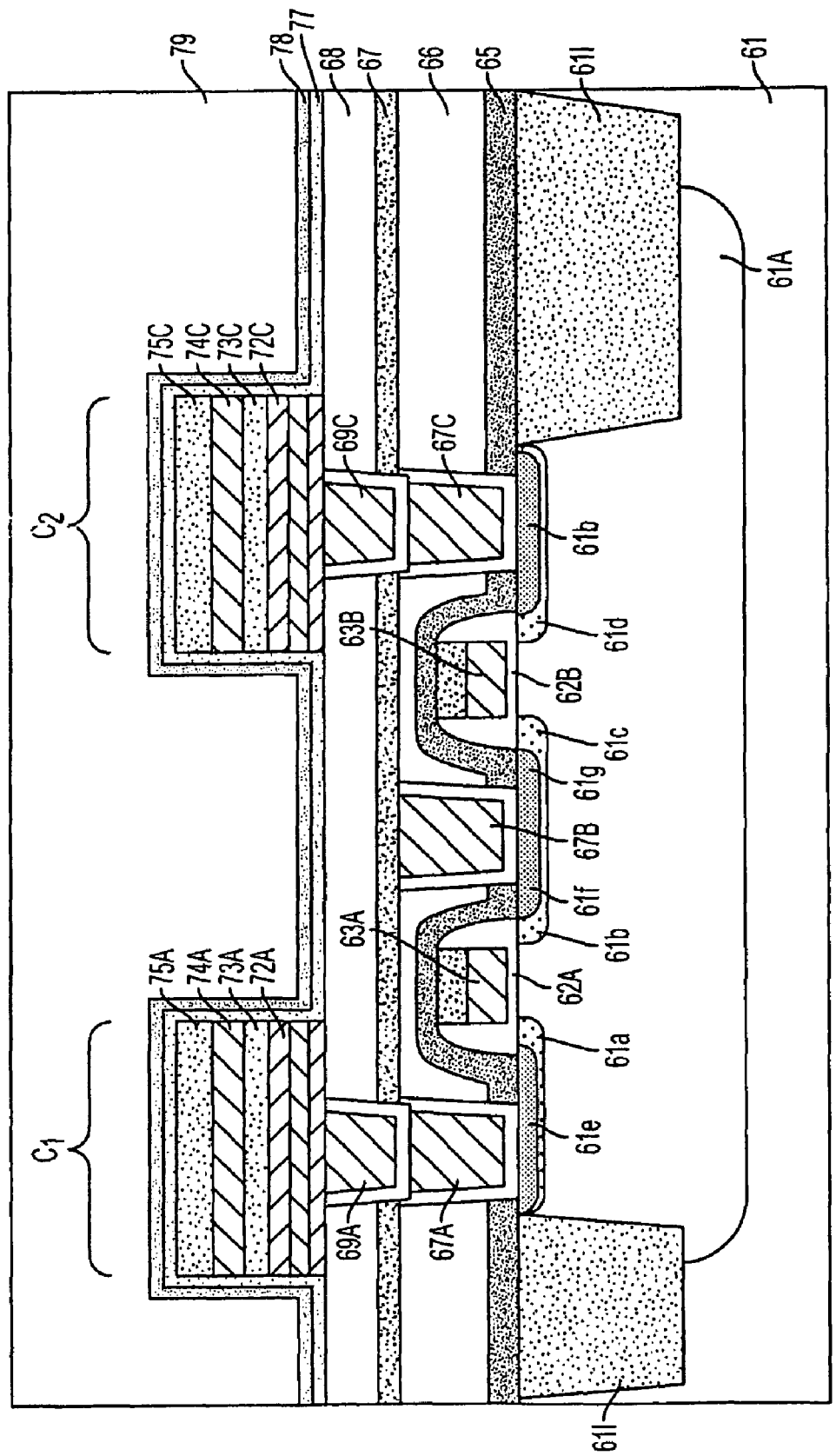
FIG. 3P illustrates a (16th) diagram describing the fabrication process of the ferroelectric memory according to the first embodiment.

Further, in FIG. 3O, a next Al2O3 film 78 is formed on the Al2O3 film of FIG. 3N also as a hydrogen barrier film by a MOCVD process with a thickness of 20 nm, for example, and an interlayer insulation film 79 of a silicon oxide film is formed in FIG. 3P so as to cover the Al2O3 hydrogen barrier films 77 and 78 thus formed, by a plasma CVD process that uses a mixed gas of TEOS and oxygen and helium for the source material with a thickness of 1500 nm.

Figure 3Q:
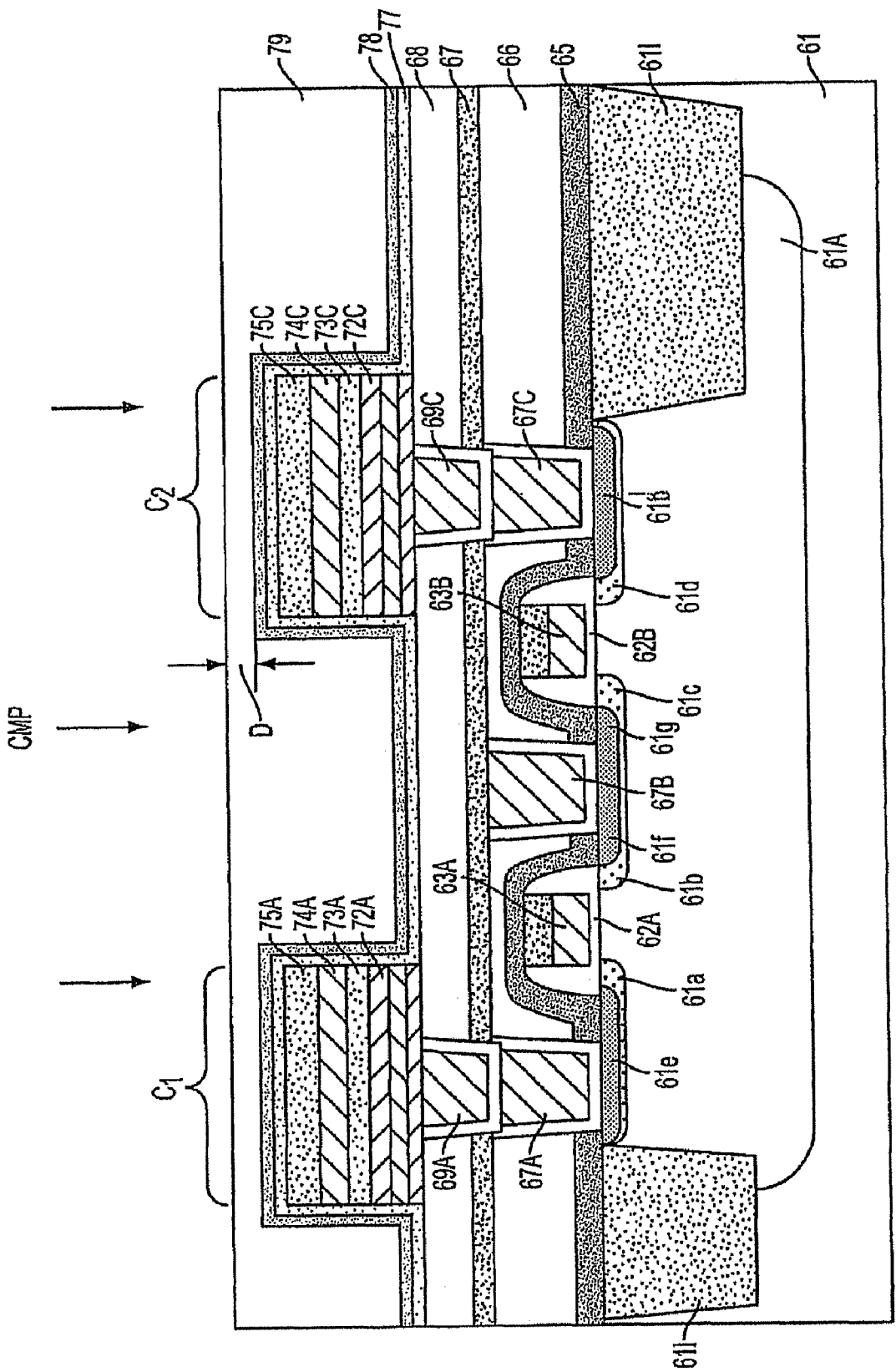
FIG. 3Q illustrates a (17th) diagram describing the fabrication process of the ferroelectric memory according to the first embodiment.

Next, in FIG. 3Q, the surface of the interlayer insulation film 79 thus formed is planarized by a CMP process. Thereby, it should be noted that the present embodiment controls the CMP process condition such as a process time such that the film thickness of the interlayer insulation film 79 becomes 50-100 nm on the ferroelectric capacitors C1 and C2. Further, in FIG. 3Q, the obtained structure is annealed in plasma that uses N20 or nitrogen gas and water in the interlayer insulation film 79 is removed. In FIG. 3Q, it should be noted that the interlayer insulation film 79 has a thickness of 740 nm, for example, as a result of planarization by the CMP process.

Figure 3R:
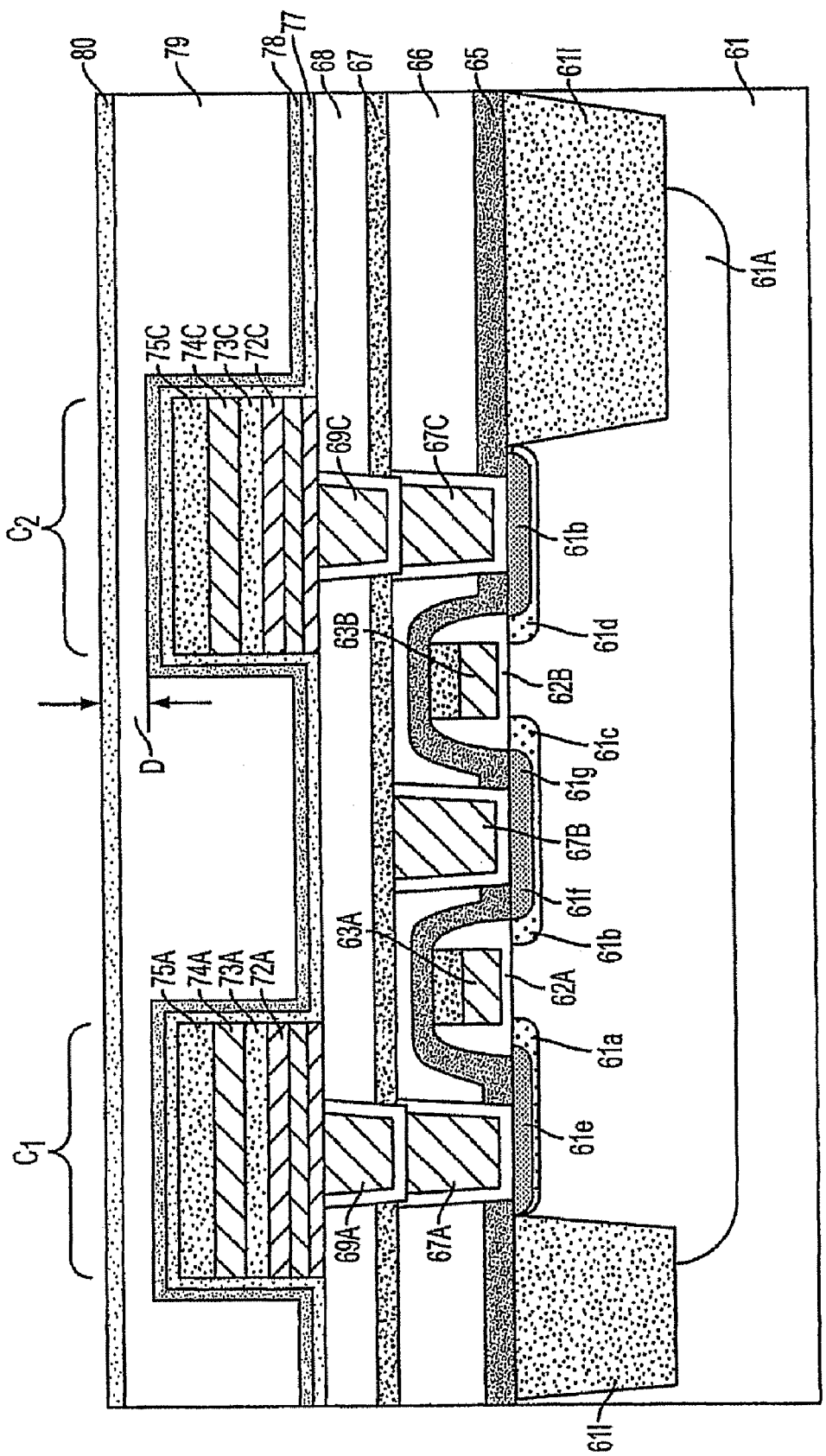
FIG. 3R illustrates a (18th) diagram describing the fabrication process of the ferroelectric memory according to the first embodiment.
Figure 3S:
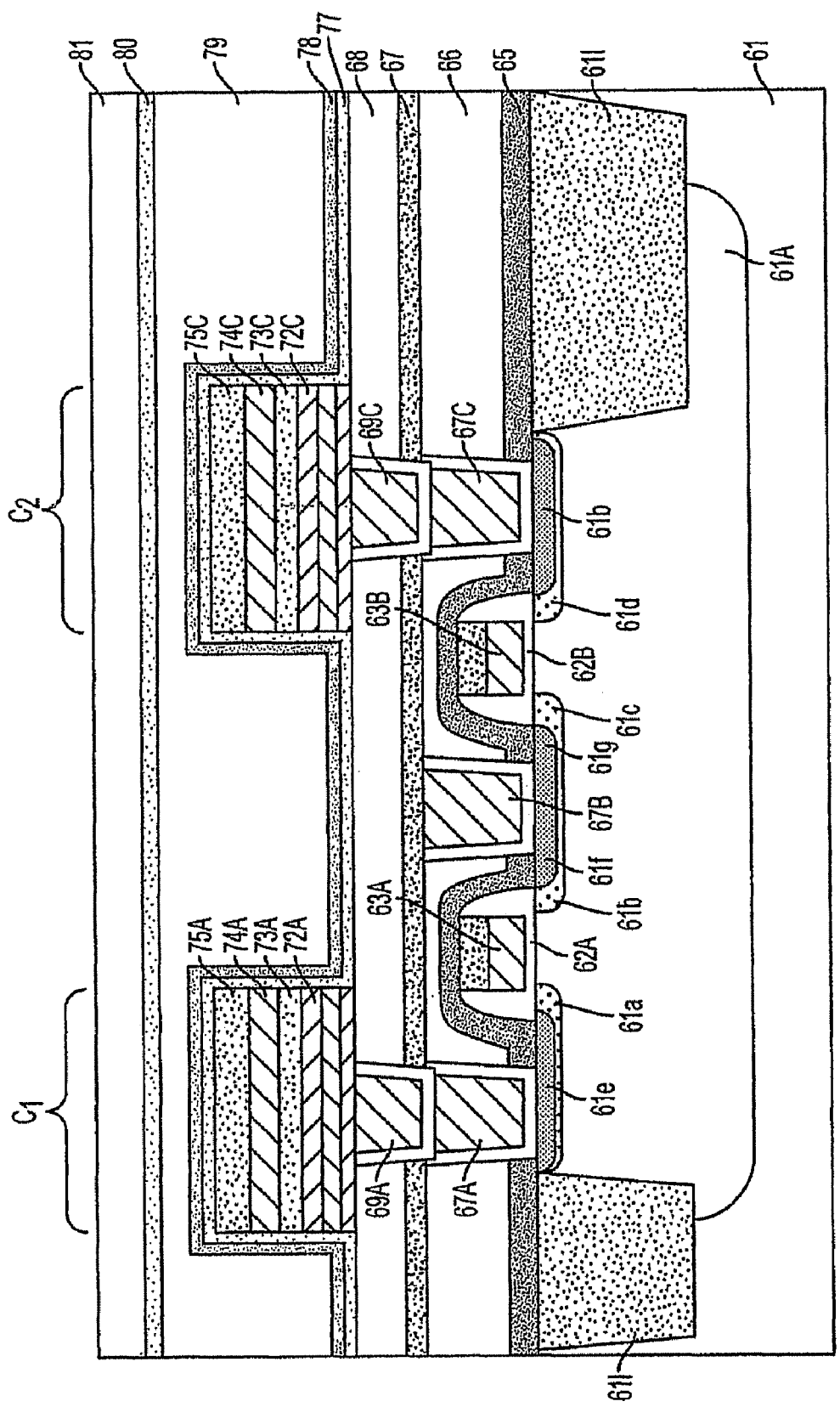
FIG. 3S illustrates a (19th) diagram describing the fabrication process of the ferroelectric memory according to the first embodiment.

Next, in FIG. 3R, an Al2O3 film 80 is formed on the interlayer insulation film 79 with a thickness of 20-100 nm by a sputtering process or MOCVD process as a hydrogen barrier film, and an interlayer insulation film 81 of silicon oxide film is formed on the hydrogen barrier film 80 in FIG. 3S by a plasma CVD process of a TEOS source with a thickness of 300-500 nm.

Figure 3T:
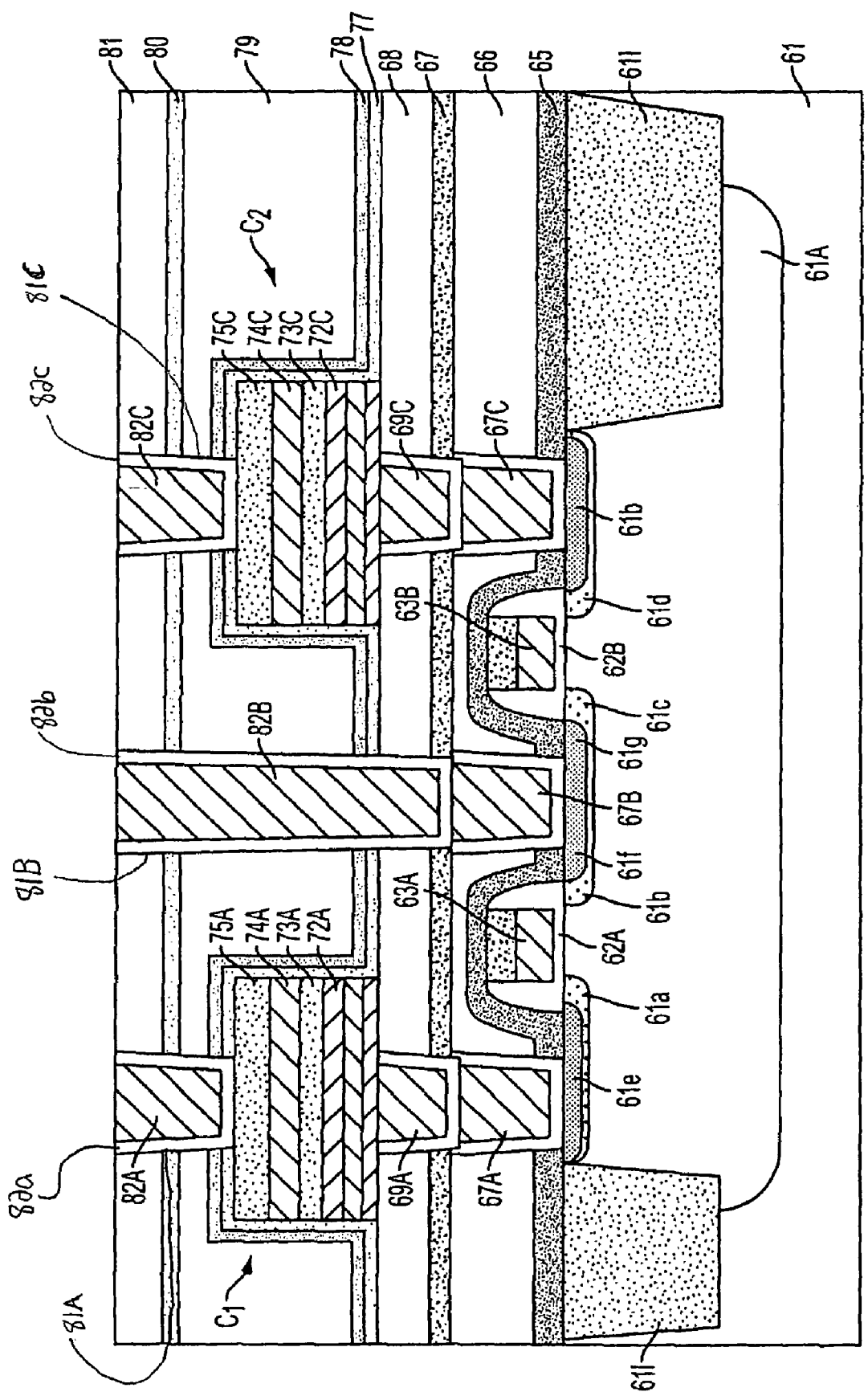
FIG. 3T illustrates a (20th) diagram describing the fabrication process of the ferroelectric memory according to the first embodiment.

Further, in FIG. 3T, a via-hole 81A exposing the upper electrode 74A of the ferroelectric capacitor C1 and a via-hole 81C exposing the upper electrode 74C of the ferroelectric capacitor C2 are formed in the interlayer insulation film 81. Further, a thermal annealing process is conducted in an oxidizing gas ambient via the via-holes 81A and 81C thus formed and the oxygen defects formed in the PZT films 73A and 73C as a result of such a via-hole formation process are compensated.

Next, the bottom surfaces and inner wall surfaces of the via-holes 81A and 81C are covered by barrier metal films 82a and 82c of a TiN single layer film, and the via-hole 81A is filled with a tungsten plug 82A and the via-hole 81C is filled with a tungsten plug 82C.

Further, after formation of the tungsten plugs 82A and 82C, there is formed a via-hole 81B in the interlayer insulation film 81 exposing the via-plug 67B and the via-hole 81B is filled with a tungsten via-plug 82B. As usual, the tungsten via-plug 82B is accompanied with an adhesion film 82b of the Ti/TiN laminated structure.

Figure 3U:
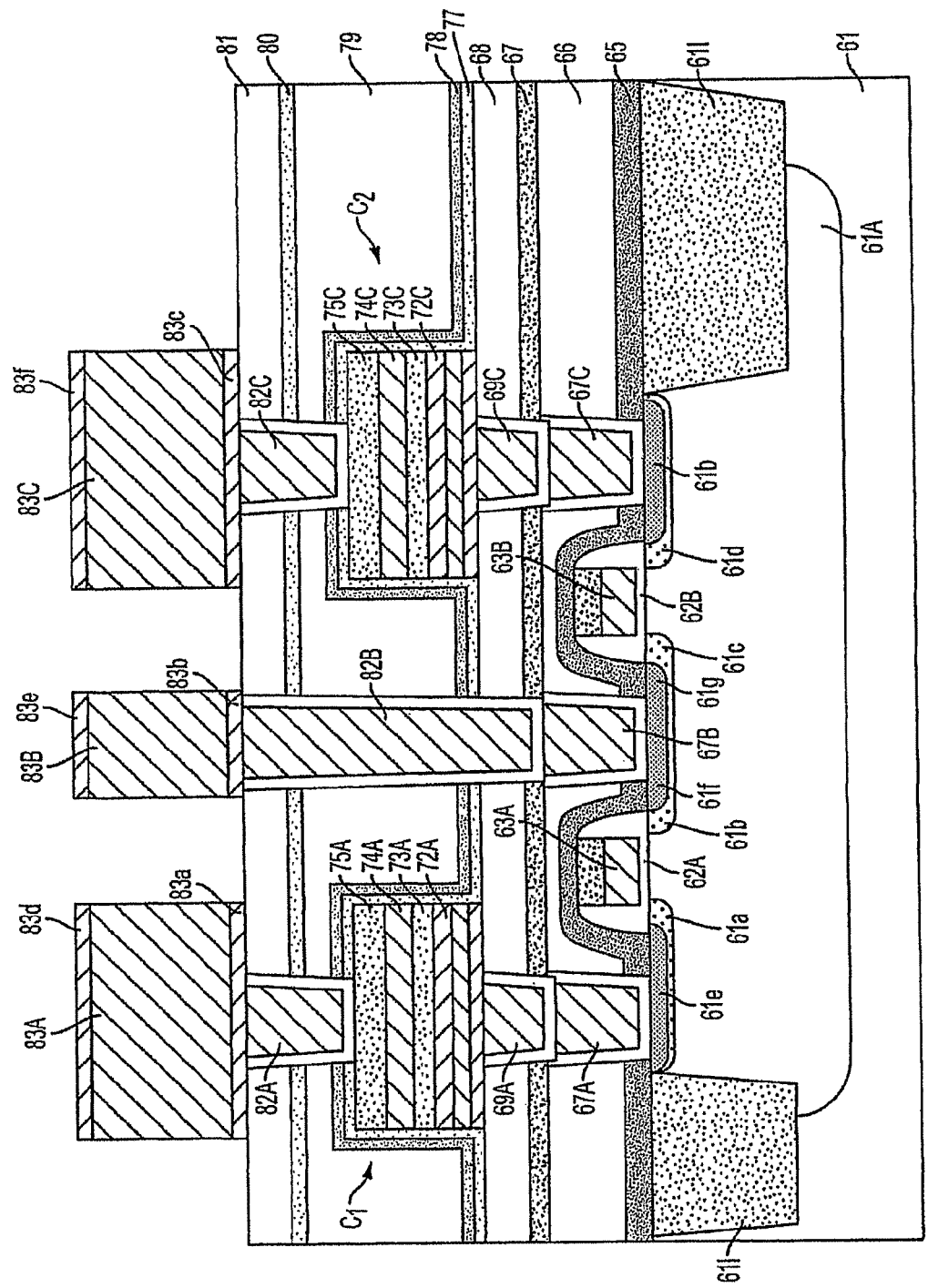
FIG. 3U illustrates a (21st) diagram describing the fabrication process of the ferroelectric memory according to the first embodiment.

Further, in FIG. 3U, an interconnection pattern 83A of an AlCu alloy is formed on the interlayer insulation film 81 in correspondence to the via-plug 82A in the form sandwiched by adhesion films 83a and 83d of the Ti/TiN lamination structure. Similarly, an interconnection pattern 83B of an AlCu alloy is formed on the interlayer insulation film 81 in correspondence to the via-plug 82B in the form sandwiched by adhesion films 83b and 83e of the Ti/TiN lamination structure. Further, an interconnection pattern 83C of an AlCu alloy is formed on the interlayer insulation film 81 in correspondence to the via-plug 82C in the form sandwiched by adhesion films 83c and 83f of the Ti/TiN lamination structure.

Further, a further interconnection layer may be provided on the structure of FIG. 3U.

With the ferroelectric memory thus formed, it is possible to reduce the film thickness of the interlayer insulation film 79 to be generally equal to the height of the ferroelectric capacitors C1 and C2 as a result of the CMP process of FIG. 3Q, and the amount of water that may penetrate into the ferroelectric capacitors C1 and C2 across the hydrogen barrier film 77 and induce deterioration of the characteristics thereof is reduced because of the resulting volume decrease attained.

Figure 4:
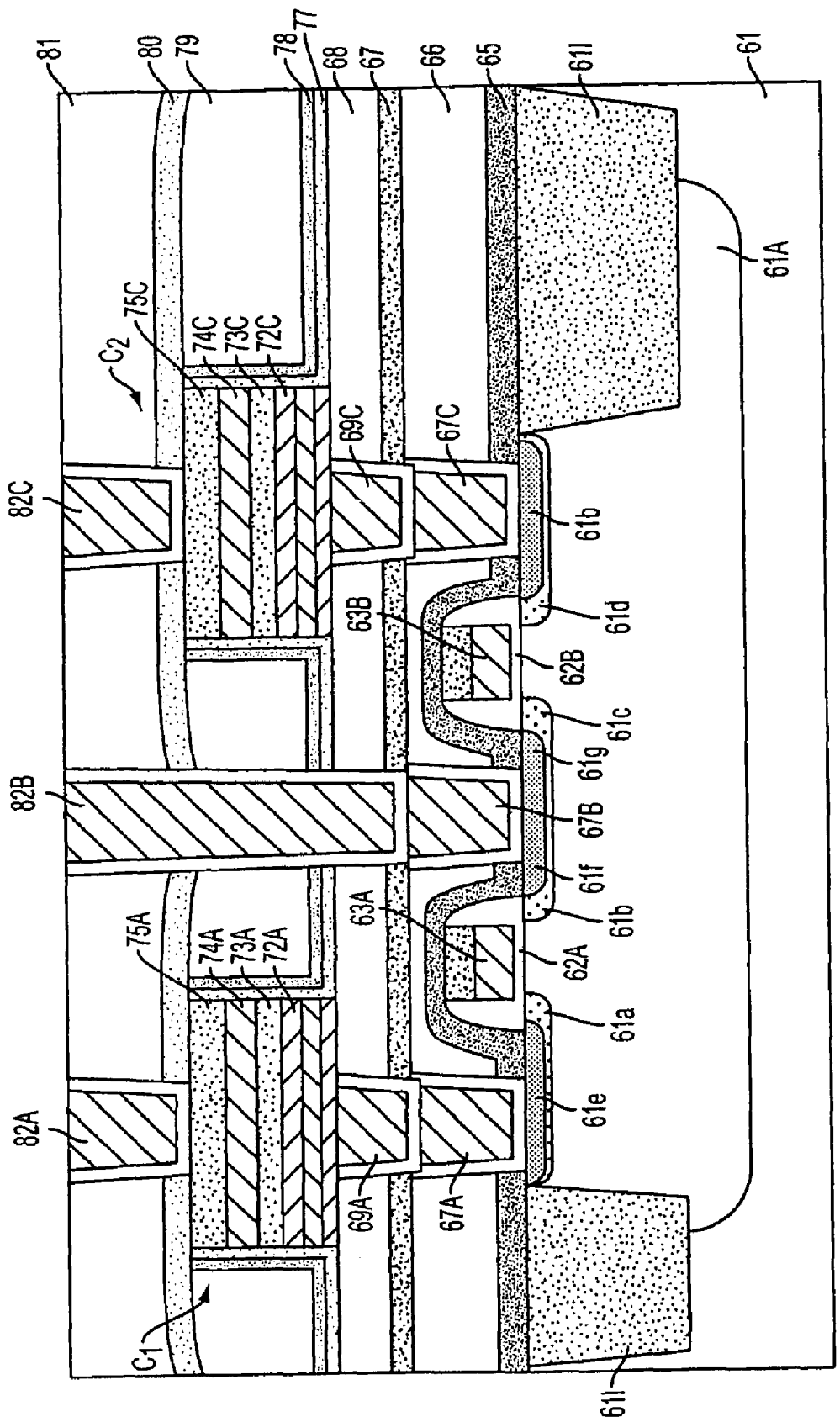
FIG. 4 illustrates a state of the ferroelectric memory according to the first embodiment.

Thereby, even in the a case where the CMP process of FIG. 3Q has been conducted excessively because of non-uniformity of the CMP process in the plane of the wafer, further progress of the CMP process is blocked by the polish-resistant films 75A and 75C of the ferroelectric capacitors C1 and C2 shown in FIG. 4, and the formation of defective devices is prevented. Thus, no degradation of production yield of the semiconductor devices occurs even when the tolerance D of the interlayer insulation film 59 is set to 50-100 nm as noted above.

Figure 5:
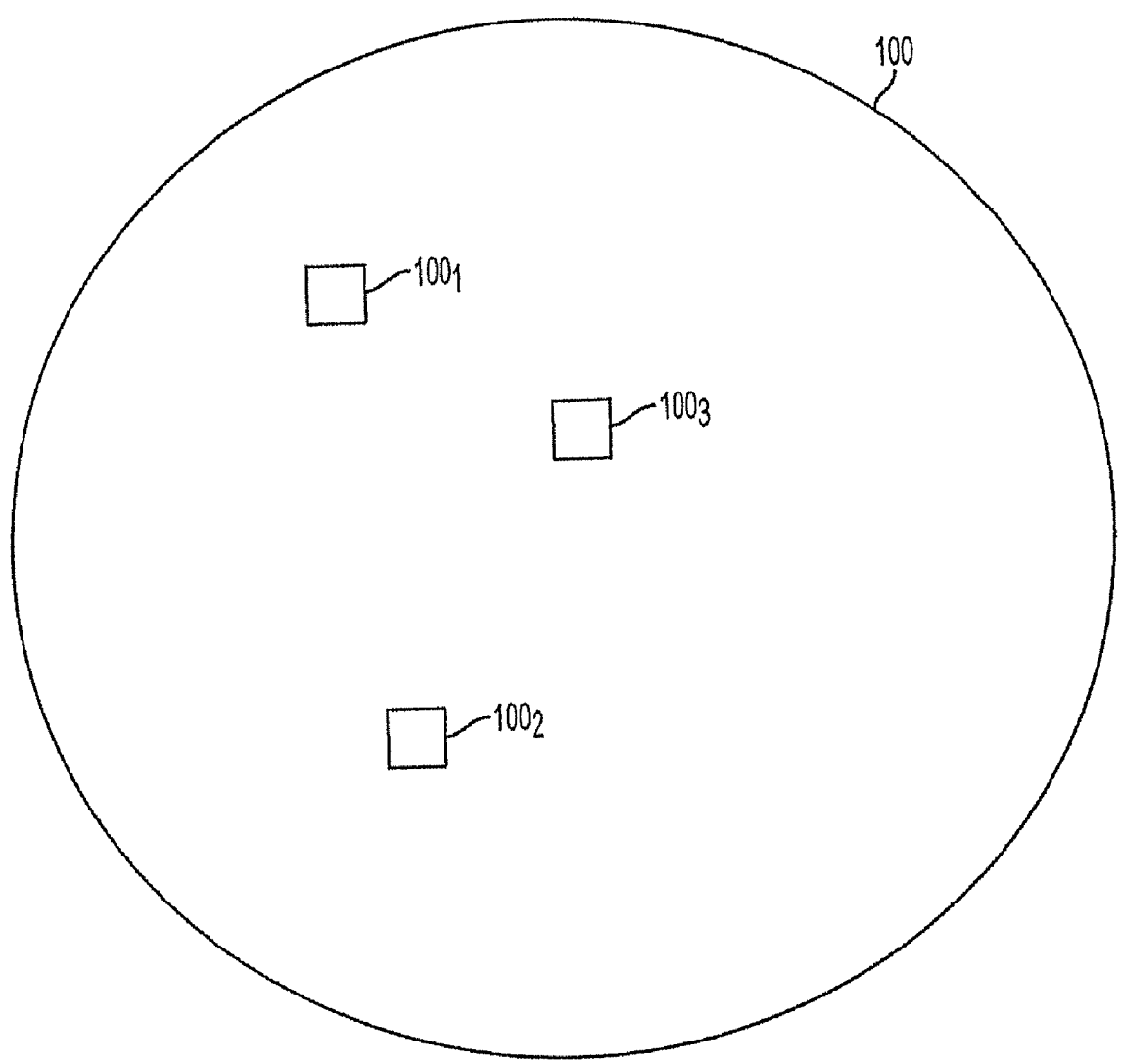
FIG. 5 illustrates a semiconductor wafer formed with the ferroelectric memory according to the first embodiment.

In such a case, elements $100_1$, $100_2$, $100_3$, . . . , which expose the polish-resistant films 75A and 75C as shown in FIG. 5, are formed on the semiconductor wafer 100 with a scattered distribution or with a clustered distribution.

Second Embodiment

Figure 6:
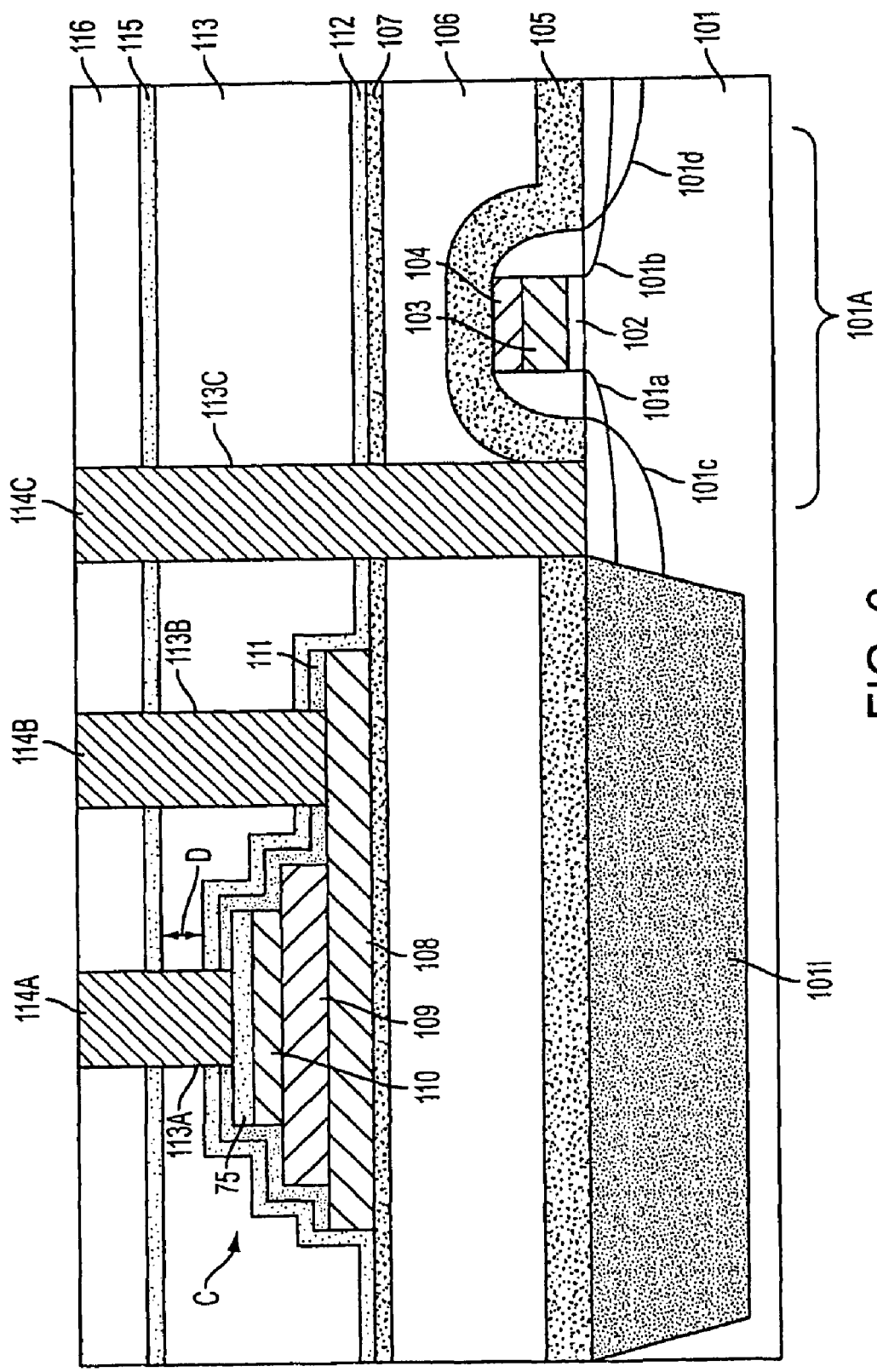
FIG. 6 illustrates the construction of a ferroelectric memory according to a second embodiment.

It should be noted that the foregoing construction of the present embodiment is not limited to the ferroelectric memory of a stacked structure in which the ferroelectric capacitor is formed on a via-plug, but also in a ferroelectric memory of a so-called planar structure shown in FIG. 6 in which the ferroelectric capacitor is formed with an offset from the via-plug and is connected to the memory cell transfer transistor via an upper interconnection.

Hereinafter, a second embodiment of the embodiments will be described with reference to FIG. 6.

Referring to FIG. 6, there is formed a device region 101A of n-type, for example, in a silicon substrate 101 by a device isolation structure 101I, and a polysilicon gate electrode 103 of p-type is formed on the silicon substrate 101 in the device region 101A via a gate insulation film 102.

In the device region 101A of the same silicon substrate 101, there is formed a first diffusion region 101a of p--type at a first side of the gate electrode 103, while there is formed a second diffusion region 101b of the same p--type at the second side of the gate electrode 103. Further, the gate electrode 103 is formed with sidewall insulation films, and diffusion regions 101c and 101d of p+-type are formed in the silicon substrate 101 at the respective outer sides of the sidewall insulation films.

Further, there is formed an SiON film 105 on the silicon substrate 101 so as to cover the gate electrode 104, and an interlayer insulation film 106 is formed on the SiON film 105.

Further, the interlayer insulation film 106 is covered by another SiON film 107 that constitutes an oxygen barrier film, and a ferroelectric capacitor C is formed on the SiON film 107 over the device isolation structure 101I in the form of stacking of a lower electrode 108, a ferroelectric film 109 and an upper electrode 110. A polish-resistant film 75 is formed on the upper electrode 110.

Here, it should be noted that the lower electrode 108 is formed by a sputtering process similarly to the lower electrode layer 72 explained previously, and the upper electrode is formed by a sputtering process similarly to the upper electrode layer 74 explained previously.

The ferroelectric capacitor C is covered by a hydrogen barrier film 111 of an Al2O3 film and another Al2O3 film 112 is formed thereon so as to cover the SiON film 107 also as a hydrogen barrier film.

Further, an interlayer insulation film 113 is formed on the hydrogen barrier film 112 so as to cover the ferroelectric capacitor C, and the interlayer insulation film 113 is subjected to planarization by a CMP process in the step corresponding to the step of FIG. 3Q. Here, it should be noted that the interlayer insulation film 113 corresponds to the interlayer insulation film 79 of the previous embodiment, wherein the present embodiment sets the distance D to the surface of the interlayer insulation film 113 over the ferroelectric capacitor C to 50-100 nm.

Further, there is formed a hydrogen barrier film 115 of Al2O3 film on the interlayer insulation film 113 with a process similar to that of FIG. 3R, and a next interlayer insulation film 116 is formed on the hydrogen barrier film 115 similarly to that of FIG. 3S.

Further, in the interlayer insulation film 116, there are formed via-holes 113A and 113B exposing the upper electrode 110 and the lower electrode 108, and via-plugs 114A and 114B are formed respectively in the via-holes 113A and 113B after conducting oxygen defect compensation of the ferroelectric film 109 via such via-holes 113A and 113B.

Further, after formation of the via-plugs 114A and 114B, a tungsten via-plug 114C is formed in a via-hole 113C exposing the diffusion region 101c.

Third Embodiment

In the structure of FIG. 4 explained previously, in which the polish-resistant films 75A and 75C of the capacitors C1 and C2 are exposed, there appears dishing in the interlayer insulation film 79 more or less as shown in FIG. 3Q as a result of the CMP process of FIG. 3Q.

Thus, with the third embodiment of the embodiments, such a dishing is used effectively to reduce the film thickness and hence volume of the interlayer insulation film 79 and reduce the amount of water confined underneath the hydrogen barrier film 80.

Figure 7:
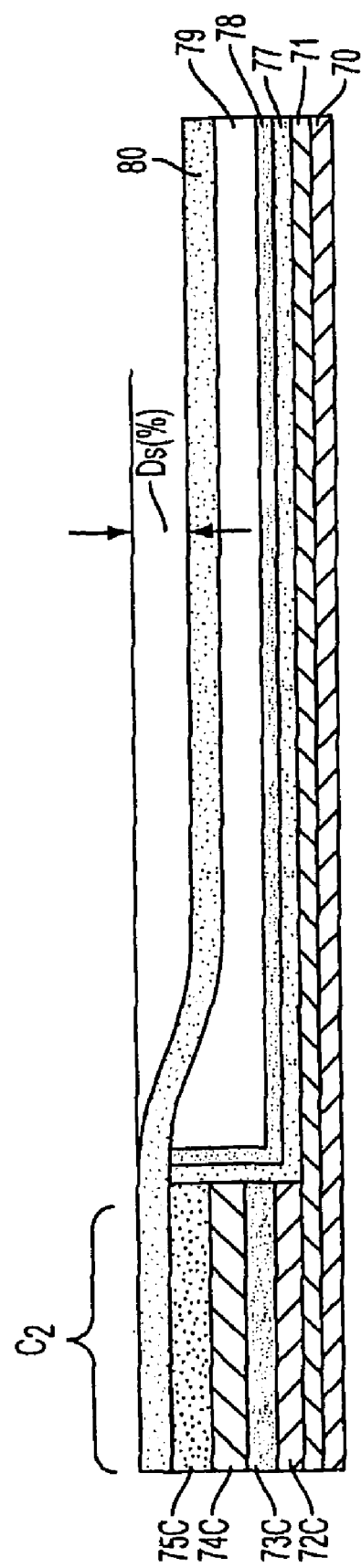
FIG. 7 illustrates the construction of a ferroelectric memory according to a third embodiment.

FIG. 7 shows the construction of a ferroelectric memory according to the third embodiment. In FIG. 7, only the part that includes a part of the ferroelectric capacitor C2 is represented. In the figure, those parts corresponding to the parts explained previously are designated by the same reference numerals and the description thereof will be omitted.

Referring to FIG. 7, the present embodiment uses a material that shows a polishing rate of ½ or less of the interlayer insulation film 79 formed of plasma TEOS film in the case a CMP process of an oxide film is applied, such as Ir, IrO, TiN, Pt, or the like, for the polish-resistant film 75C, and the polishing duration at the time of the CMP process of FIG. 3R is extended. With this, there is induced a dishing Ds on the surface of the interlayer insulation film 79 with a depth corresponding to 20% or more of the film thickness of the interlayer insulation film. Here, the dishing Ds represents a ratio of the dishing depth to the initial film thickness of the interlayer insulation film 79.

In the case of inducing the dishing Ds of 20% in the interlayer insulation film 79 of a plasma TEOS film having a thickness of 1500 nm by a CMP process while using Ir or Pt for the polish-resistant film 75C, the duration of the CMP process may be extended by 20% or more in view of the fact that it needs a time of about 200 seconds until the polishing substantially reaches the surface of the ferroelectric capacitor.

By reducing the thickness of the interlayer insulation film 79 to 20% or more in the part offset from the ferroelectric capacitor C2 by dishing, invasion of water into the ferroelectric capacitor C2 from the interlayer insulation film 79 across the hydrogen barrier films 77 and 78 is reduced, and the degradation of characteristics of the ferroelectric capacitor is reduced. Further, because of reduced film thickness of the interlayer insulation film 79, the distance from the interconnection pattern to the substrate is decreased also in the case the next interlayer insulation film 81 and the interconnection patterns 83A-83C are formed as shown in FIG. 3U, and it becomes possible to form the contact holes easily.

Further, while the embodiments have been explained heretofore, the embodiments are by no means limited to particular embodiments, but various variations and modifications may be made without departing from the scope of the embodiments.

What is claimed is:

1. A semiconductor device, comprising:
   a first interlayer insulation film formed over a substrate;
   a ferroelectric capacitor formed over the first interlayer insulation film;
   a second interlayer insulation film formed on the first interlayer insulation film so as to cover the ferroelectric capacitor,
   wherein the ferroelectric capacitor includes a lower electrode, a ferroelectric film formed on the lower electrode, an upper electrode formed on the ferroelectric film in contact therewith, and a polish-resistant film formed on the upper electrode, a top surface of the second interlayer insulation film being coincident to a top surface of the polish-resistant film in the part covering the ferroelectric film, and the top surface of the second interlayer insulation film causing dishing with a depth of 20% or more with regard to a film thickness of the second interlayer insulation film.

2. The semiconductor device of claim 1, wherein the upper electrode is formed of a conductive oxide of Ir or Ru.

3. The semiconductor device as claimed in claim 2, wherein the conductive oxide constituting the upper electrode is characterized by larger oxygen content at a side contacting the ferroelectric film and smaller oxygen content at a side contacting the polish-resistant film.

4. The semiconductor device as claimed in claim 1, wherein the conductive oxide constituting the upper electrode is characterized by larger oxygen content at a side contacting the ferroelectric film and smaller oxygen content at a side contacting the polish-resistant film.

5. The semiconductor device as claimed in claim 1, wherein the polish-resistant film is formed of any of Pt, Ir, Ti, TiN, W, Al or $SrRuO_3$.

6. The semiconductor device as claimed in claim 1, wherein the second interlayer insulation film is formed by a plasma CVD process that uses TEOS as a source material.

7. The semiconductor device as claimed in claim 1, further comprising
a first hydrogen barrier film formed on the second interlayer insulation film.

8. The semiconductor device as claimed in claim 7, further comprising a third interlayer insulation film formed on the first hydrogen barrier film.

9. A method for fabricating a semiconductor device, the method comprising:

forming a first interlayer insulation film over a substrate;

forming a ferroelectric capacitor including a lower electrode, a ferroelectric film formed on the lower electrode, an upper electrode formed on the ferroelectric film in contact therewith, and a polish-resistant film formed on the upper electrode,over the first interlayer insulation film;

forming a second interlayer insulation film formed over the first interlayer insulation film so as to cover the ferroelectric capacitor polishing the second interlayer insulation film until the polish-resistant film is exposed so as to form a dishing at the top surface of the second interlayer insulation film with a depth of 20% or more of a film thickness of the second interlayer insulation film.

10. The method for fabricating a semiconductor device as claimed in claim 9, wherein the polish-resistant film is formed of any of Pt, Ir, Ti, TiN, W, Al or $SrRuO_3$.

11. The method for fabricating a semiconductor device as claimed in claim 9, further comprising:
forming a hydrogen barrier film on the second interlayer insulating film.

12. The method for fabricating a semiconductor device as claimed in claim 9, further comprising covering a sidewall surface and a top surface of the ferroelectric capacitor with another hydrogen barrier film.

13. The method for fabricating a semiconductor device as claimed in claim 7, wherein the forming the second interlayer insulation film is conducted by a plasma CVD process that uses TEOS as a source material.

14. The method for fabricating a semiconductor device as claimed in claim 7, wherein the polishing is conducted by CMP process.

15. The method for fabricating a semiconductor device as claimed in claim 11, further comprising forming a third interlayer insulation film on said hydrogen barrier film.

* * * * *

UNITED STATES PATENT AND TRADEMARK OFFICE
CERTIFICATE OF CORRECTION

| | | |
|---|---|---|
| PATENT NO. | : 7,803,640 B2 | Page 1 of 1 |
| APPLICATION NO. | : 11/946467 | |
| DATED | : September 28, 2010 | |
| INVENTOR(S) | : Kazutoshi Izumi | |

It is certified that error appears in the above-identified patent and that said Letters Patent is hereby corrected as shown below:

Column 13, Line 20 in Claim 4, delete "claim 1," and insert --claim 2,--, therefor.

Signed and Sealed this
Twenty-sixth Day of July, 2011

David J. Kappos
*Director of the United States Patent and Trademark Office*